United States Patent
Igarashi

(10) Patent No.: US 11,670,743 B2
(45) Date of Patent: Jun. 6, 2023

(54) LIGHT EMITTING DEVICE AND METHOD OF MANUFACTURING LIGHT EMITTING DEVICE

(71) Applicant: NICHIA CORPORATION, Anan (JP)

(72) Inventor: Takayuki Igarashi, Yokohama (JP)

(73) Assignee: NICHIA CORPORATION, Anan (JP)

( * ) Notice: Subject to any disclaimer, the term of this patent is extended or adjusted under 35 U.S.C. 154(b) by 134 days.

(21) Appl. No.: 16/987,662

(22) Filed: Aug. 7, 2020

(65) Prior Publication Data

US 2021/0043810 A1 Feb. 11, 2021

(30) Foreign Application Priority Data

Aug. 8, 2019 (JP) .............................. JP2019-146488

(51) Int. Cl.
| | | |
|---|---|---|
| H01L 33/50 | (2010.01) | |
| H01L 33/00 | (2010.01) | |
| H01L 33/48 | (2010.01) | |
| H01L 27/15 | (2006.01) | |

(52) U.S. Cl.
CPC .......... *H01L 33/504* (2013.01); *H01L 27/156* (2013.01); *H01L 33/005* (2013.01); *H01L 33/486* (2013.01); *H01L 2933/0041* (2013.01)

(58) Field of Classification Search
CPC ... H01L 33/504; H01L 27/156; H01L 33/005; H01L 33/486; H01L 2933/0041; H01L 33/56; H01L 33/60; H01L 2933/005; H01L 2933/0058; H01L 2933/0091; H01L 25/0753; H01L 33/50; H01L 33/54
See application file for complete search history.

(56) References Cited

U.S. PATENT DOCUMENTS

| | | | | |
|---|---|---|---|---|
| 2015/0207045 | A1* | 7/2015 | Wada | H01L 33/505 |
| | | | | 438/27 |
| 2015/0380322 | A1* | 12/2015 | Shimonishi | H01L 22/24 |
| | | | | 438/15 |
| 2016/0093780 | A1* | 3/2016 | Beppu | H01L 21/3213 |
| | | | | 438/27 |
| 2016/0284679 | A1* | 9/2016 | Moosburger | H01L 33/60 |
| 2018/0033924 | A1* | 2/2018 | Andrews | H01L 33/62 |
| 2019/0386183 | A1* | 12/2019 | Frischeisen | C09J 183/04 |

FOREIGN PATENT DOCUMENTS

| | | |
|---|---|---|
| CN | 108550679 A | 9/2018 |
| JP | 2003-282957 A | 10/2003 |
| JP | 2009-182307 A | 8/2009 |
| JP | 2012-156443 A | 8/2012 |
| JP | 2013-012559 A | 1/2013 |
| JP | 2014-207349 A | 10/2014 |
| JP | 2015-220307 A | 12/2015 |
| JP | 2017-076673 A | 4/2017 |
| JP | 2017-112295 A | 6/2017 |
| JP | 2018-174334 A | 11/2018 |

* cited by examiner

*Primary Examiner* — Jonathan Han
(74) *Attorney, Agent, or Firm* — Foley & Lardner LLP

(57) ABSTRACT

A light emitting device includes: a substrate; a plurality of light emitting elements mounted on the substrate; a covering member disposed on the substrate between adjacent ones of the light emitting elements such that an upper surface of the covering member is substantially coplanar with upper surfaces of the light emitting elements, wherein the covering member is a molded body containing an inorganic material powder and a binder; and a light transmissive member disposed on or above the plurality of light emitting elements.

12 Claims, 13 Drawing Sheets

LIGHT EMITTING DEVICE AND METHOD OF MANUFACTURING LIGHT EMITTING DEVICE

CROSS-REFERENCE TO RELATED APPLICATION

This application claims priority to Japanese Patent Application No. 2019-146488, filed on Aug. 8, 2019, the contents of which are hereby incorporated by reference in their entirety

BACKGROUND

1. Technical Field

The present disclosure relates to a light emitting device and a method of manufacturing a light emitting device.

2. Description of Related Art

There is known in the art a light emitting device including a substrate and a light emitting element mounted on the substrate.

For example, Japanese Patent Publication No. 2018-174334 A describes a light emitting device including wiring substrates, light emitting elements each mounted on an upper surface of a respective one of the wiring substrates, and light reflective members each disposed on a respective one of the wiring substrates and in contact with lateral surfaces of a respective one of the light emitting elements.

SUMMARY

One object of certain embodiments of the present disclosure is to provide a light emitting device having high luminance and high contrast, and a method of manufacturing the light emitting device.

A light emitting device according to one embodiment of the present disclosure includes: a substrate; a plurality of light emitting elements mounted on the substrate; a covering member disposed on the substrate between adjacent ones of the light emitting elements such that an upper surface of the covering member is substantially coplanar with upper surfaces of the light emitting elements; and a light transmissive member disposed on or above the plurality of light emitting elements. The covering member is a molded body containing an inorganic material powder and a binder.

A light emitting device according to one embodiment of the present disclosure includes: a substrate; a plurality of light emitting elements mounted on the substrate; light transmissive members spaced apart from each other corresponding to the plurality of light emitting elements and disposed on or above the light emitting elements; and a covering member disposed on the substrate between adjacent ones of the light emitting elements and between adjacent ones of the light transmissive members such that an upper surface of the covering member is substantially coplanar with upper surfaces of the light transmissive members. The covering member is a molded body containing inorganic material powder and a binder.

A light emitting device according to one embodiment of the present disclosure includes: a substrate; a plurality of light emitting elements mounted on the substrate; a covering member disposed on the substrate between adjacent ones of the light emitting elements such that an upper surface of the covering member is substantially coplanar with upper surfaces of the light emitting elements; and a light transmissive member disposed on or above the plurality of light emitting elements. The covering member is a molded body of $TiO_2$ powder.

A light emitting device according to one embodiment of the present disclosure includes: a substrate; a plurality of light emitting elements mounted on the substrate; light transmissive members spaced apart from each other corresponding to the plurality of light emitting elements and disposed on or above the light emitting elements; a covering member disposed on the substrate between adjacent ones of the light emitting elements and between adjacent ones of the light transmissive members such that an upper surface of the covering member is substantially coplanar with upper surfaces of the light transmissive members. The covering member is a molded body of $TiO_2$ powder.

A method of manufacturing a light emitting device according to one embodiment of the present disclosure includes: mounting a plurality of light emitting elements on a substrate; disposing a covering member on the substrate between adjacent ones of the light emitting elements such that an upper surface of the covering member is substantially coplanar with upper surfaces of the light emitting elements; and disposing a light transmissive member on or above the plurality of light emitting elements.

The step of disposing the covering member includes: filling a space on the substrate between the light emitting elements with an inorganic material powder, and impregnating the inorganic material powder with a binder solution.

A method of manufacturing a light emitting device according to one embodiment of the present disclosure includes: providing a substrate on which a plurality of light emitting elements with light transmissive members are disposed, each of the light transmissive members disposed on or above a respective one of the plurality of light emitting elements; and disposing a covering member on the substrate between adjacent ones of the light emitting elements and between adjacent ones of the light transmissive members such that an upper surface of the covering member is substantially coplanar with upper surfaces of the light transmissive members. The step of disposing the covering member includes filling a space on the substrate between adjacent ones of the light emitting elements and between adjacent ones of the light transmissive members with an inorganic material powder, and impregnating the inorganic material powder with a binder solution.

A method of manufacturing a light emitting device according to one embodiment of the present disclosure includes: mounting a plurality of light emitting elements on a substrate; disposing a covering member on the substrate between the light emitting elements to be identical in height to upper surfaces of the light emitting elements; and disposing a light transmissive member on or above the plurality of light emitting elements. The step of disposing the covering member includes filling a space on the substrate between adjacent ones of the light emitting elements with a $TiO_2$ powder.

A method of manufacturing a light emitting device according to one embodiment of the present disclosure includes: providing a substrate on which a plurality of light emitting elements with light transmissive members are disposed, each of the light transmissive members disposed on or above a respective one of the plurality of light emitting elements; and disposing a covering member on the substrate between adjacent ones of the light emitting elements and between adjacent ones of the light transmissive members such that an upper surface of the covering member is substantially coplanar with upper surfaces of the light transmissive members.

The step of disposing the covering member includes filling a space on the substrate between adjacent ones of the light emitting elements and between adjacent ones of the light transmissive members with $TiO_2$ powder.

The light emitting device according to certain embodiments of the present disclosure has high luminance and high contrast.

The method of manufacturing a light emitting device according to certain embodiments of the present disclosure allows for manufacturing a light emitting device having high luminance and high contrast.

DETAILED DESCRIPTION

Figure 1A:
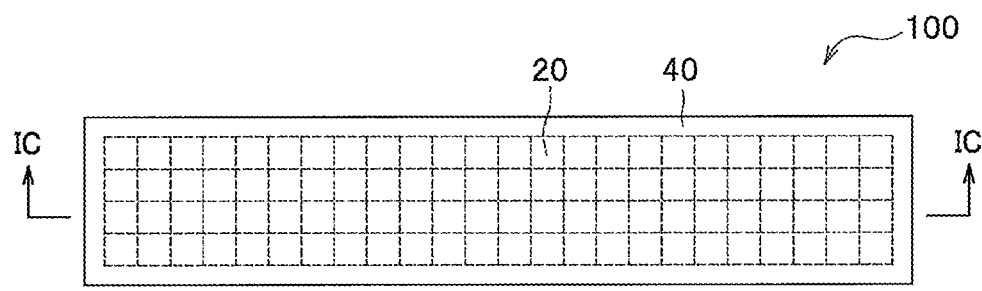
FIG. 1A is a plan view schematically showing the structure of a light emitting device according to a first embodiment.

Certain embodiments of the present invention will be described below with reference to the drawings. The embodiments described below are intended to show examples of a light emitting device and examples of a method of manufacturing a light emitting device for giving a concrete form to the technical ideas of the present invention. However, the present invention is not intended to be limited to the embodiments described below. The size, material, shape, relative positions and the like of components in the embodiment are intended as examples and not intended to limit the scope of the present invention thereto, unless otherwise specified. The sizes, positional relationships and the like in the drawings may be exaggerated for the sake of clarity.

First Embodiment

Light Emitting Device

Figure 1B:
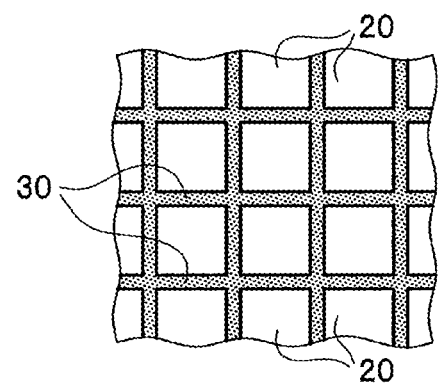
FIG. 1B is a schematic partial enlarged view of the light emitting device in FIG. 1A, transparently showing a portion of the light emitting device shown in FIG. 1A.
Figure 1C:
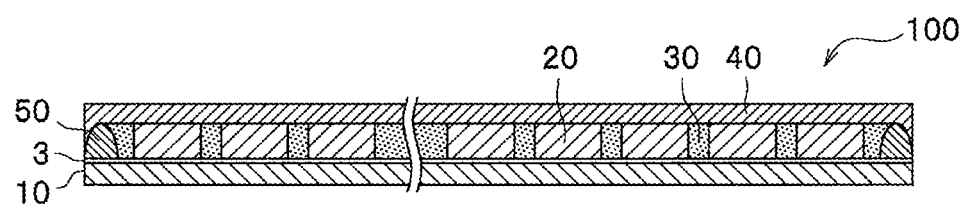
FIG. 1C is a schematic cross-sectional view of the light emitting device taken along line IC-IC in FIG. 1A.
Figure 1D:
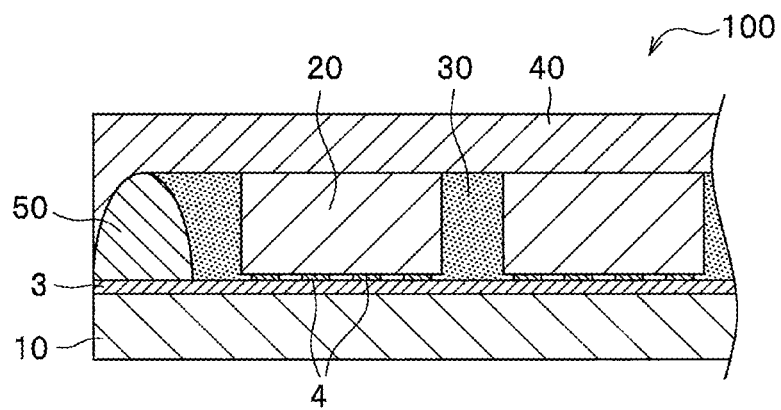
FIG. 1D is a schematic partial enlarged view of FIG. 1C.
Figure 2:
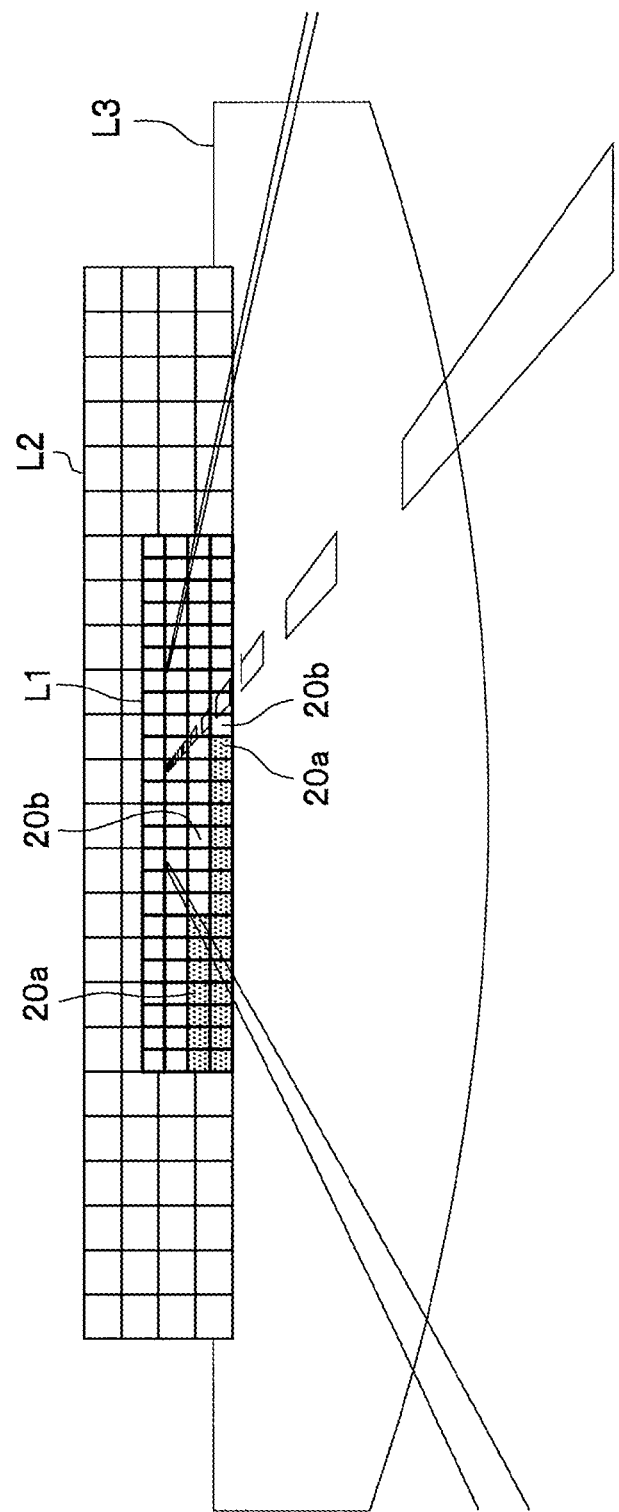
FIG. 2 is a schematic diagram for describing a light-emission state of the light emitting device according to the first embodiment, schematically showing regions irradiated with light emitted from an automobile headlight in which the light emitting device according to the first embodiment is employed as an example.

FIG. 1A is a plan view schematically showing the structure of a light emitting device according to a first embodiment. FIG. 1B is a schematic partial enlarged view of the light emitting device in FIG. 1A, transparently showing a portion of the light emitting device shown in FIG. 1A. FIG. 1C is a cross-sectional view of the light emitting device taken along line IC-IC in FIG. 1A. FIG. 1D is a partial enlarged view of FIG. 1C. FIG. 2 is a schematic diagram for describing a light-emission state of the light emitting device according to the first embodiment, schematically showing regions irradiated with light emitted from an automobile headlight in which the light emitting device according to the first embodiment is exemplarily employed.

A light emitting device 100 includes: a substrate 10; a plurality of light emitting elements 20 mounted on the substrate 10; a covering member 30 disposed on the substrate 10 between the light emitting elements 20 such that an upper surface of the covering member 30 is substantially coplanar with upper surfaces of the light emitting elements 20; and a light transmissive member 40 disposed above the plurality of light emitting elements 20. The covering member 30 is a molded body that contains inorganic material powder and a binder.

The light emitting device 100 further includes a frame body 50 disposed on the substrate 10 and surrounding the plurality of light emitting elements 20. The covering member 30 is disposed between the frame body 50 and the light emitting elements 20.

That is, the light emitting device 100 mainly includes the substrate 10, the light emitting elements 20, the covering member 30, the light transmissive member 40, and the frame body 50.

Components of the light emitting device 100 will be described below.

The plurality of light emitting elements 20 are disposed on the substrate 10, and the substrate 10 electrically connects the light emitting device 100 to an external power source. The substrate 10 has, for example, a substantially rectangular shape as seen in a plan view. Wiring parts 3 are disposed on the upper surface of the substrate 10.

For the substrate 10, an insulating material is preferably used, and a material that is less likely to transmit light emitted from the light emitting elements 20 or external light is preferably used. For example, ceramic such as alumina, aluminum nitride, or mullite, thermoplastic resin such as PA (polyamide), PPA (polyphthalamide), PPS (polyphenylene sulfide), or liquid crystal polymer, or resin such as epoxy resin, silicone resin, modified epoxy resin, urethane resin, and phenolic resin may be used.

The substrate may have a recessed cavity, and the light emitting elements 20 may be mounted in the cavity.

The wiring parts 3 are disposed on the upper surface of the substrate 10, and are electrically connected to the light emitting elements 20. Each of the wiring parts 3 has a terminal electrically connected to the external power source.

The wiring parts 3 may be formed of, for example, a metal such as Fe, Cu, Ni, Al, Ag, Au, Al, Pt, Ti, W, and Pd, or alloy including at least one of the foregoing metals. The wiring part 3 may be disposed using electroplating, electroless plating, vapor deposition, sputtering or the like.

The light emitting elements 20 are semiconductor elements that emit light upon application of voltage. Emission color of the light emitting elements 20 can be selected to have any appropriate wavelength according to the intended use. For example, for the light emitting element 20 configured to emit blue light (light having a wavelength in a range of 430 nm to 490 nm) and/or green light (light having a wavelength in a range of 495 nm to 565 nm), nitride-based semiconductors ($In_XAl_YGa_{1-X-Y}N$, $0 \leq X$, $0 \leq Y$, $X+Y \leq 1$), GaP or the like can be used. For the light emitting element 20 configured to emit red light (light having a wavelength in a range of 610 nm to 700 nm), nitride-based semiconductor elements or GaAlAs, AlInGaP, or the like can be used.

Each of the light emitting elements 20 is flip-chip mounted on a corresponding one of the wiring parts 3 on the substrate 10 via corresponding ones of conductive bonding members 4. The conductive bonding members 4 may be, for example, eutectic solder, conductive paste, bumps or the like.

The light emitting device 100 includes a plurality of light emitting elements 20. In one example, a total of ninety-six light emitting elements 20 are arranged in a matrix of twenty-four rows and four columns on the substrate 10. The light emitting device 100 is configured such that individual light emitting elements 20 or a group of light emitting elements 20 of the plurality of light emitting elements 20 can be turned on and off.

A distance between adjacent ones of the light emitting elements 20 is preferably 70 µm or less. With the distance of 70 µm or less between adjacent light emitting elements 20, the light emitting device 100 can have higher luminance, and a length of non-emission region between adjacent light emitting elements 20 can be reduced, which allows for reducing dark portions between respective adjacent light emitting elements 20. The distance between adjacent ones of the light emitting elements 20 is more preferably 50 µm or less. With the distance of 50 µm or less between adjacent light emitting elements 20, the light emitting device 100 can have further higher luminance, and a length of non-emission region between adjacent light emitting elements 20 can be further reduced, which allows for reducing dark portions between respective adjacent light emitting elements 20. For ease of manufacturing, the distance between adjacent light emitting elements 20 is preferably 40 µm or more.

The covering member 30 is disposed on the substrate 10 between adjacent light emitting elements 20, and is located adjacent to the light emitting elements 20 such that the upper surface of the covering member 30 is substantially coplanar with the upper surfaces of the light emitting elements 20. The covering member 30 is disposed on the substrate 10 between the frame body 50 and the light emitting elements 20, and is located adjacent to the light emitting elements 20 such that the upper surface of the covering member 30 is substantially coplanar with the upper surfaces of the light emitting elements 20. That is, the covering member 30 is disposed to fill the entirety of a space between adjacent light emitting elements 20, and the entirety of a space between the frame body 50 and the light emitting elements 20. In the light emitting device 100, the upper surface of the covering member 30 and the upper surfaces of the light emitting elements 20 are substantially in the same plane.

The covering member 30 is not disposed between the upper surface of the substrate 10 and the lower surfaces of the light emitting elements 20. In this structure, disposing reflective member such as Ag plating on each wiring part 3 allows for improving reflectance in a region below the light emitting elements 20. The covering member 30 may be disposed between the upper surface of the substrate 10 and the lower surfaces of the light emitting elements 20.

An inorganic material may be disposed between the upper surface of the substrate 10 and the lower surfaces of the light emitting elements 20 by preparing a slurry containing the inorganic material using a low-viscosity solvent, disposing the slurry under the light emitting elements 20, and drying the slurry.

The covering member 30 is a molded body that contains inorganic material powder and a binder. More specifically, in the covering member 30, the inorganic material powder is compressed and is solidified with the binder.

With such a covering member 30, when turning on some of the light emitting elements 20 in the light emitting device 100, light emitted from the turned-on light emitting elements 20 can be impeded from being incident on adjacent ones of light emitting elements 20 that are not turned on. This allows for improving contrast of the light emitting device 100. With the covering member 30 disposed between adjacent light emitting elements 20, the amount of light extracted from the upper surfaces of the light emitting elements 20 can be increased, which allows for increasing the luminance of the light emitting device 100.

In a conventional light emitting device including a covering member containing a resin, the covering member tends to be deteriorated due to heat. Further, the resin may sink at the upper surface of the covering member, which may cause deformation of the light transmissive member on the covering member, resulting in unevenness in emission color. In the light emitting device 100 according to the present embodiment, using an inorganic material for the covering member 30 allows for reducing deterioration of the covering member that would occur when using a resin for the covering member 30. Accordingly, the operation life of the light emitting device 100 can be increased. Further, such structure allows for reducing the sink at the upper surface of the covering member 30 that would occur when using a resin for the covering member 30. This allows for reducing unevenness in emission color.

The content of the inorganic material may be in a range of, for example, 90 mass percent to 99.99 mass percent relative to the whole covering member 30.

The content of the inorganic material may be any appropriate content less than 100 mass percent.

The inorganic material may be, for example, at least one of $TiO_2$, BN, $SiO_2$, and $Al_2O_3$. Use of these substances allows for having further higher luminance and further higher contrast. The inorganic material preferably has a refractive index of 2 or more. With the refractive index of 2 or more, the effect of impeding light emitted from a turned-on light emitting element 20 from being incident on an adjacent light emitting element 20 that is not turned-on. This allows for having further higher contrast. Additionally, the reflectance of the covering member 30 can be further improved and luminance can be further increased.

For the binder, for example, polysilazane can be used. Employing polysilazane for a binder allows for facilitating binding of the inorganic material powder in the covering member 30. Polysilazane is obtained by curing a polysilazane solution, which will be described below.

The content of the binder may be in a range of, for example, 0.01 mass percent to 10 mass percent to the whole covering member 30.

The content of the binder may be any appropriate content more than 0 mass percent.

The covering member 30 may further contain silver, Al and the like. The covering member 30 containing these substances allows for increasing the effect of impeding light emitted from a turned-on light emitting element 20 from being incident on an adjacent light emitting element 20 that is not turned-on, so that contrast can be further increased. Also, the reflectance of the covering member 30 can be further improved, so that luminance can be further increased.

The light transmissive member 40 is disposed on the light extraction surface side of a plurality of light emitting elements 20. The light transmissive member 40 is continuously disposed across the entirety of upper surfaces of the plurality of light emitting elements 20. The light transmissive member 40 is also disposed on the frame body 50. In the light emitting device 100, with the light transmissive member 40 also disposed on the frame body 50, the size of the light transmissive member 40 in a plan view can be increased. Further, with the light transmissive member 40 on the frame body 50, the color of the frame body 50 can be less visible in a plan view.

The light transmissive member 40 is formed of a light-transmissive resin. The light transmissive member 40 is formed by disposing a resin of the light transmissive member on the plurality of light emitting elements 20 and on the frame body 50 using potting, spraying, or other technique, and thereafter curing the resin. Accordingly, the resin is flowed also to the outside of the frame body 50, so that the light transmissive member 40 is also formed on the outer lateral surface of the frame body 50.

Examples of a resin material used for the resin of the light transmissive member 40 includes, thermosetting resins such as an epoxy resin, a modified epoxy resin, a silicone resin, and a modified silicone resin.

The light transmissive member 40 may contain a wavelength conversion member. Examples of the wavelength conversion member include a fluorescent material. Examples of the light transmissive member 40 containing the fluorescent material include a resin containing fluorescent material powder. According to the intended use, the light transmissive member 40 may contain a diffusing member, filler and the like.

A fluorescent material known in the art can be used for the fluorescent material. For example, a yellow-color fluorescent material such as YAG ($Y_3Al_5O_{12}$:Ce) or silicate, a red-color fluorescent material such as CASN ($CaAlSiN_3$:Eu) or KSF ($K_2SiF_6$:Mn), or a green-color fluorescent material such as chlorosilicate or $BaSiO_4$:$Eu^{2+}$ may be employed.

A diffusing member known in the art can be used for the diffusing material. For example, barium titanate, titanium oxide, aluminum oxide, silicon oxide or the like can be used for the diffusing member.

The particle size of the fluorescent material may be in a range of, for example, 1 μm to 30 μm.

The frame body 50 is disposed on the substrate 10 to surround the plurality of light emitting elements 20. The frame body 50 is formed of a resin containing a reflective member. The frame body 50 has a frame-like shape corresponding to the shape of the substrate 10, and covers the upper surface of the substrate 10. The frame body 50 has a substantially rectangular annular shape in a plan view. The frame body 50 has a height that is the same as a height of the light emitting elements 20.

The distance between the frame body 50 and the light emitting elements 20 is preferably 200 μm or less. With the distance of 200 μm or less between the frame body 50 and the light emitting elements 20, the inorganic material powder between the frame body 50 and the light emitting elements 20 is easily compressed, which can facilitate filling with the inorganic material. The expression "the distance between the frame body 50 and the light emitting elements 20" in the present embodiment refers to a distance between a portion of the frame body 50 at a half of the height of the frame body 50 and a corresponding lateral surface of a corresponding one of the light emitting elements 20. The distance between the frame body 50 and the light emitting elements 20 is preferably 50 μm or more, in view of facilitating disposing the inorganic material powder between the frame body 50 and the light emitting elements 20.

In the present embodiment, a powder of an inorganic material is used for the covering member 30. Accordingly, by applying powder from above, the inorganic material is disposed between the frame body 50 and the light emitting elements 20. In this manner, it is not necessary to insert a nozzle or the like to the space between the frame body 50 and the light emitting elements 20 for filling with the resin.

Accordingly, the covering member 30 can be disposed between the frame body 50 and the light emitting elements 20 more easily than the case of using a resin for the covering member. Further, as compared to the case of using a resin for the covering member, the distance between the frame body 50 and the light emitting elements 20 can be reduced, which allows for reducing the size of the light emitting device 100.

Examples of a resin material used for the resin of the frame body 50 include thermosetting resins such as epoxy resin, modified epoxy resin, silicone resin, modified silicone resin, and the like. Examples of a light-reflective reflective material used for the reflective material of the frame body 50 include titanium oxide, silica, silicon oxide, aluminum oxide, zirconium oxide, magnesium oxide, potassium titanate, zinc oxide, and boron nitride. Among these, in view of light reflectivity, titanium oxide, which has a relatively high refractive index, is preferably used.

Operation of Light Emitting Device

When the light emitting device 100 is driven, current is supplied from an external power source to the light emitting elements 20 via the wiring parts 3, causing the light emitting elements 20 to emit light. In the light emitted from the light emitting elements 20, light propagating upward is extracted to the outside above the light emitting device 100 via the light transmissive member 40. Light propagating downward is reflected at the wiring parts 3 or the substrate 10, and is extracted to the outside of the light emitting device 100 via the light transmissive member 40.

Light propagating between the frame body 50 and the light emitting elements 20 is reflected at the covering member 30, and is extracted to the outside of the light emitting device 100 via the light transmissive member 40. Light propagating between adjacent ones of the light emitting elements 20 is reflected at the covering member 30, and extracted to the outside of the light emitting device 100 via the light transmissive member 40. With the covering member 30, which is a molded body containing inorganic material powder and a binder, disposed between adjacent ones of the light emitting elements 20, when causing some of the light emitting elements 20 to emit light, light emitted from the turned-on light emitting element 20 is impeded from being incident on an adjacent light emitting element 20 that is not turned on. This allows for increasing contrast in the light emitting device 100. Further, with the covering member 30 disposed between adjacent ones of the light emitting elements 20, luminance of the light emitting device 100 can be increased.

The light emitting device 100 may be used for, for example, an adaptive driving beam headlamp (Adaptive Driving Beam: ADB) for a vehicle. FIG. 2 shows regions irradiated with a headlight in left-hand traffic. An irradiated region L1 is a region irradiated with light emitted from the light emitting device 100 according to the present embodiment.

An irradiated region L2 and an irradiated region L3 are regions irradiated with light emitted from other light emitting devices. These three irradiated regions are an irradiated region of the headlight. The irradiated region L1 and the irradiated region L2 are regions irradiated with a high beam, and preferably have high contrast. Not only the irradiated region L1 but also the irradiated region L2 may be irradiated using the light emitting device 100 according to the present embodiment. The light emitting device 100 is configured to turn on some of the light emitting elements 20 and turn off the other of the light emitting elements 20. Thus, in the light emitting device 100, the intensity of light from the headlamp can be adjusted in accordance with the area and the luminance of the irradiated region L1 and the irradiated region L1. A contrast between a region 20*a*, to which light is irradiated from the turned-on light emitting elements, and a region 20*b*, to which light would otherwise be irradiated from light emitting elements adjacent to the turned-on light emitting element when the light emitting elements adjacent to the turned-on light emitting element are turned on, can be increased.

Method of Manufacturing Light Emitting Device

Next, one example of a method of manufacturing the light emitting device according to the first embodiment will be described below.

Figure 3:
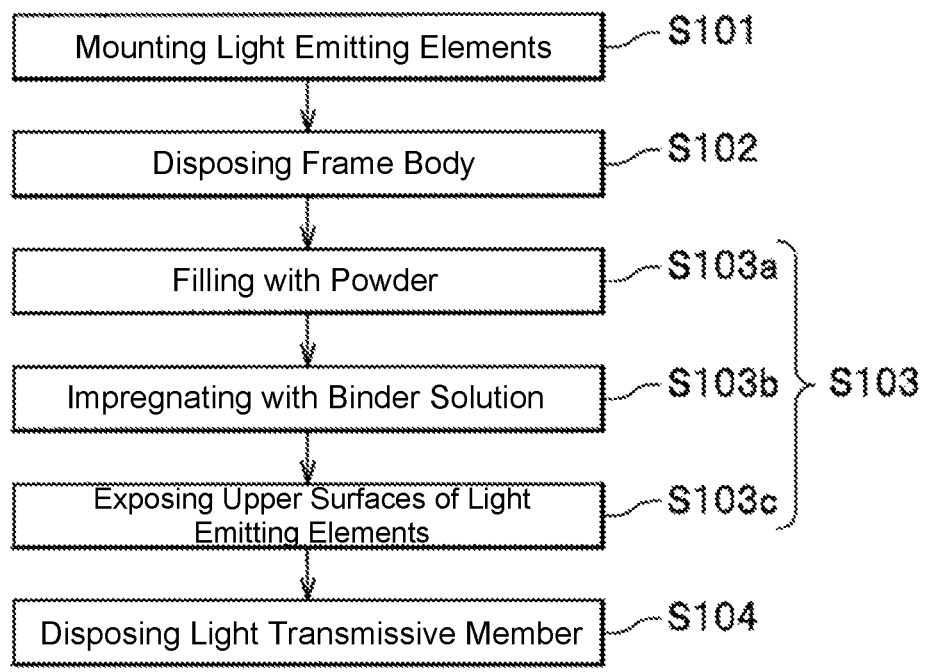
FIG. 3 is a flowchart of a method of manufacturing the light emitting device according to the first embodiment.
Figure 4A:
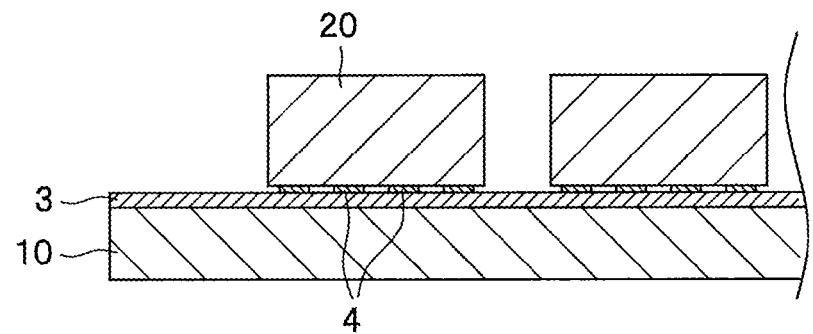
FIG. 4A is a cross-sectional view schematically showing mounting light emitting elements in the method of manufacturing the light emitting device according to the first embodiment.
Figure 4B:
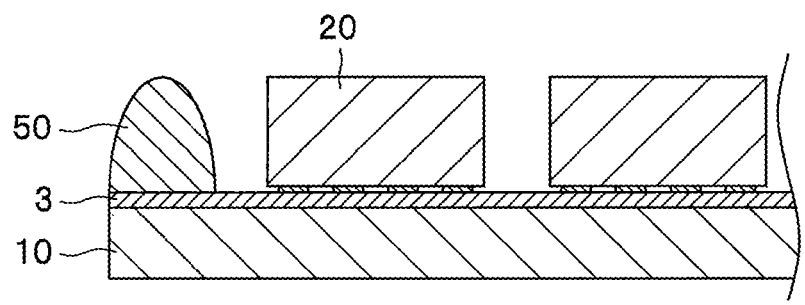
FIG. 4B is a cross-sectional view schematically showing disposing a frame body in the method of manufacturing the light emitting device according to the first embodiment.
Figure 4C:
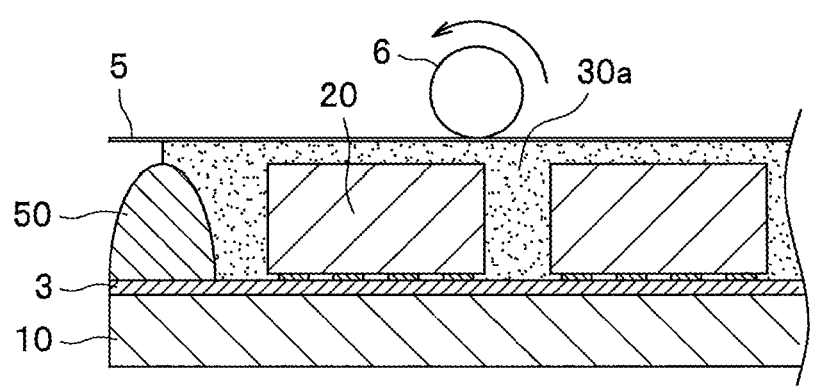
FIG. 4C is a cross-sectional view schematically showing filling a space with an inorganic material powder in the method of manufacturing the light emitting device according to the first embodiment.
Figure 4D:
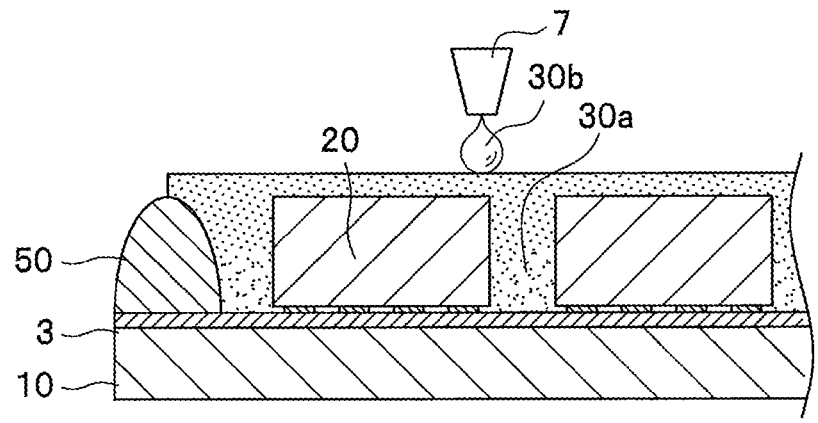
FIG. 4D is a cross-sectional view schematically showing impregnating with a binder solution in the method of manufacturing the light emitting device according to the first embodiment.
Figure 4E:
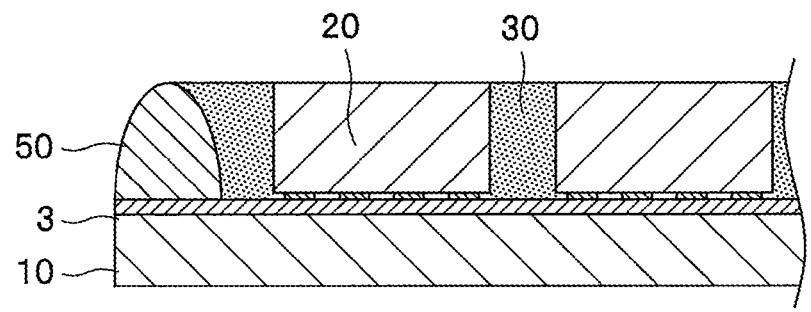
FIG. 4E is a cross-sectional view schematically showing exposing upper surfaces of the light emitting elements in the method of manufacturing the light emitting device according to the first embodiment.
Figure 4F:
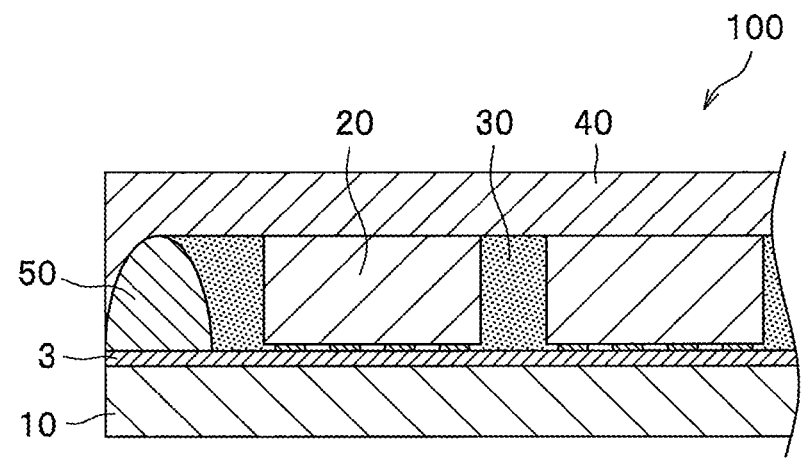
FIG. 4F is a cross-sectional view schematically showing disposing a light transmissive member in the method of manufacturing the light emitting device according to the first embodiment.

FIG. 3 is a flowchart of the method of manufacturing the light emitting device according to the first embodiment. FIG. 4A is a cross-sectional view schematically showing mounting light emitting elements in the method of manufacturing the light emitting device according to the first embodiment. FIG. 4B is a cross-sectional view schematically showing disposing a frame body in the method of manufacturing the light emitting device according to the first embodiment. FIG. 4C is a cross-sectional view schematically showing filling with inorganic material powder in the method of manufacturing the light emitting device according to the first embodiment. FIG. 4D is a cross-sectional view schematically showing impregnating with a binder solution in the method of manufacturing the light emitting device according to the first embodiment. FIG. 4E is a cross-sectional view schematically showing exposing the upper surfaces of the light emitting elements in the method of manufacturing the light emitting device according to the first embodiment. FIG. 4F is a cross-sectional view schematically showing disposing the light transmissive member in the method of manufacturing the light emitting device according to the first embodiment.

The method of manufacturing the light emitting device 100 includes: a step S101 of mounting a light emitting element, in which a plurality of light emitting elements 20 are mounted on the substrate 10; a step S102 of disposing a frame body, in which the frame body 50 is disposed to surround the plurality of light emitting elements 20; a step S103 of disposing a covering member, in which the covering member 30 is disposed on the substrate 10 between adjacent ones of the light emitting elements 20 such that an upper surface of the covering member 30 is substantially coplanar with upper surfaces of the light emitting elements 20; and a step S104 of disposing a light transmissive member of disposing the light transmissive member 40 above the plurality of light emitting elements 20.

The step S103 of disposing a covering member includes: a step S103*a* of filling with a powder, in which a space on the substrate 10 between adjacent ones of the light emitting elements 20 is filled with an inorganic material powder; a step S103*b* of impregnating with a binder solution, in which the inorganic material powder is impregnated with a binder solution; and a step S103*c* of exposing upper surfaces of the light emitting elements, in which a solid of the inorganic material powder is polished to expose the upper surfaces of the light emitting elements 20.

The materials, arrangement, and the like of the members are identical to those of the light emitting device 100 described above and, therefore, detailed description thereof may be omitted when appropriate.

Mounting Light Emitting Elements

In the step S101 of mounting a light emitting element, a plurality of light emitting elements 20 are mounted on the substrate 10.

The light emitting elements 20 are flip-chip mounted on the wiring parts 3 on the upper surface of the substrate 10 via the conductive bonding member 4, with an electrode-formed surface of each light emitting element 20 serving as a mount surface.

Disposing Frame Body

In the step S102 of disposing a frame body, the frame body 50 is disposed to surround the plurality of light emitting elements 20.

For example, using a discharging device (a resin discharging device) configured to continuously discharge a liquid resin by gas pressure, the frame body 50 may be disposed at a desired position on the substrate 10 to have substantially the same height as a height of the light emitting elements 20 (for example, see JP 2009-182307 A). The resin employed for the frame body 50 has a viscosity that has been adjusted.

The frame body 50 can be applied a single or a plurality of times to have a predetermined height, and may be disposed to have a height greater than a height of the light emitting elements 20. In this case, by subjecting the frame body 50 to polishing, grinding, cutting, or the like, the frame body 50 may have a height identical to a height of the light emitting element 20.

Disposing Covering Member

In the step S103 of disposing a covering member, the covering member is disposed on the substrate 10 between the light emitting elements 20 such that an upper surface of the covering member 30 is substantially coplanar with the upper surfaces of the light emitting elements 20. In the step S103, the covering member 30 is disposed between the frame body 50 and the light emitting elements 20.

The step S103 includes a step S103a of filling with a powder, a step S103b of impregnating with a binder solution, and a step S103c of exposing upper surfaces of the light emitting elements.

Filling with Powder

In the step S103a of filling with a powder, a space on the substrate 10 between adjacent ones of the light emitting element 20 is filled with the inorganic material powder 30a. In the S103a, a space on the substrate 10 between the frame body 50 and the light emitting elements 20 is also filled with the inorganic material powder 30a.

In the step S103a, on the substrate 10, the inorganic material powder 30a is disposed such that a top of the inorganic material powder 30a is located above the upper surfaces of the light emitting elements 20, so as to cover the upper surfaces of the light emitting elements 20. Next, a plate-like member 5 is disposed on the inorganic material powder 30a, and the powder is compressed by a roller 6 via the plate-like member 5. Examples of the plate-like member 5 include a glass plate, a metal plate, a ceramic plate, and the like. Instead of the roller 6, a device configured to apply pressure evenly from above the inorganic material powder 30a, such as a press machine, may be used to perform compressing.

Impregnating with Binder Solution

The step S103b of impregnating with a binder solution is a step of impregnating the inorganic material powder with a binder solution 30b.

In this step S103b, for example, from above the inorganic material powder 30a, the binder solution 30b is dripped using a pipet 7 so that the inorganic material powder 30a is entirely impregnated with the binder solution 30b. Next, for example, under a condition of the temperature in a range of 150° C. to 200° C. and the time in a range of 4 hours to 48 hours, the binder is cured to obtain a solid of the inorganic material powder. Thus, the covering member 30 is formed. Any appropriate amount of the binder solution that allows for obtaining a solid of the inorganic material powder can be employed.

Examples of the binder solution include a polysilazane solution, which is a glass solution. Any appropriate polysilazane solution may be used for the binder solution. For example, a commercially available glass solution may be used.

Exposing Upper Surfaces of Light Emitting Elements

In the step S103c of exposing upper surfaces of the light emitting elements, the solid of the inorganic material powder is polished down to expose the upper surfaces of the light emitting elements 20.

In the step S103c, the upper surface of the solid of the inorganic material powder which has been impregnated with the binder solution and solidified is polished to remove a portion of the covering member 30. Thus, the covering member 30 covering the upper surfaces of the light emitting elements 20 is removed, so that the upper surfaces of the light emitting element 20 are exposed. Accordingly, the upper surface of the covering member 30 and the upper surfaces of the light emitting elements 20 are in the same plane. When removing a portion of the covering member 30 to expose the upper surfaces of the light emitting elements 20, the portion of the covering member 30 may be removed by grinding, cutting or the like. When removing a portion of the covering member 30, the substrate of the light emitting elements 20 may also be slightly polished, ground, cut or the like. When the frame body 50 is formed to have a height greater than a height of the light emitting element 20 in the step S102 of disposing a frame body, removing of a portion of the frame body 50 may be performed simultaneously with the removing of a portion of the covering member 30.

Disposing Light Transmissive Member

In the step S104 of disposing a light transmissive member, the light transmissive member 40 is disposed above the plurality of light emitting elements 20.

In this step S104, by potting, spraying or the like, the resin to be the light transmissive member is disposed on the plurality of light emitting elements 20 and the frame body 50. Next, the resin is cured at a temperature in a range of, for example, 120° C. to 200° C., to form the light transmissive member 40.

Second Embodiment

Light Emitting Device

Figure 5:
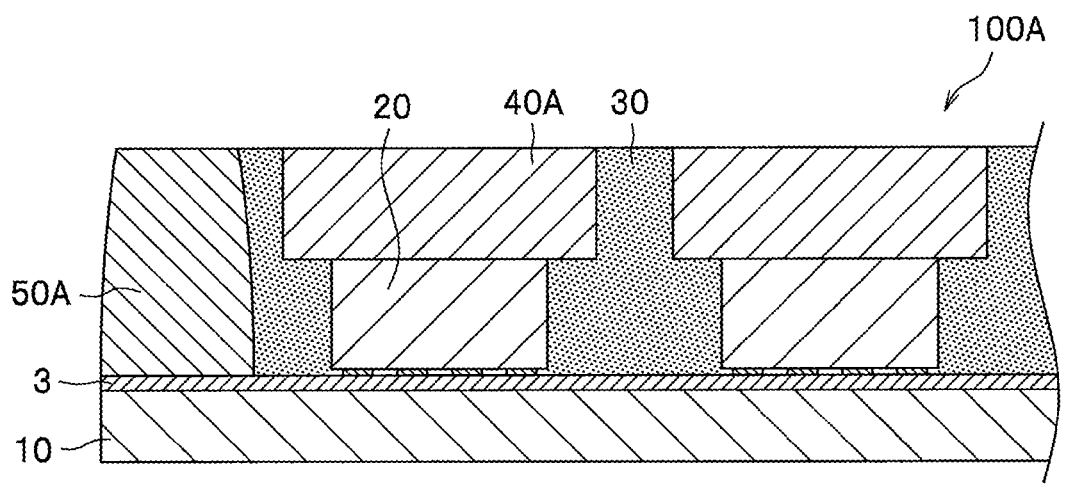
FIG. 5 is a cross-sectional view schematically showing a portion of the structure of a light emitting device according to a second embodiment.

FIG. 5 is a cross-sectional view schematically showing a portion of a structure of a light emitting device according to a second embodiment.

A light emitting device 100A includes: a substrate 10; a plurality of light emitting elements 20 mounted on the substrate 10; light transmissive members 40A spaced apart from each other corresponding to the plurality of light emitting elements 20 above the light emitting elements 20; and a covering member 30 disposed on the substrate 10 between adjacent ones of the light emitting elements 20 and between adjacent ones of the light transmissive members 40A such that an upper surface of the covering member 30 is substantially coplanar with upper surfaces of the light transmissive members 40A. The covering member 30 is a molded body that contains inorganic material powder and a binder. The light emitting device 100A further includes, on the substrate 10, a frame body 50A surrounding the plurality of light emitting elements 20. The covering member 30 is disposed between the frame body 50A and the light emitting element 20.

The main differences between the light emitting device 100A and the light emitting device 100 will be described below.

The light emitting device 100A is different from the light emitting device 100 in a shape of a light transmissive members 40A, a shape and a height of a frame body 50A, and a height of the covering member 30.

In the light emitting device 100A, the light transmissive members 40A are spaced apart from each other corresponding to respective light emitting elements 20.

The light transmissive members 40A are member formed of, for example, resin, glass, an inorganic material or the like. Each of the light transmissive members 40A is disposed for a respective one of the light emitting elements 20.

The light transmissive members 40A may contain a wavelength conversion member. Examples of the wavelength conversion member include a fluorescent material. Examples of the light transmissive members 40A containing a fluorescent material include a sintered body of a fluorescent material, or glass, ceramic, or other inorganic material containing fluorescent material powder. According to the intended use, the light transmissive members 40A may contain a diffusing member, a filler and the like.

The lower surface of each light transmissive member 40A is wider than the upper surface of a respective light emitting element 20. The distance between the light transmissive members 40A is preferably 30 µm or less. When the distance between the light transmissive members 40A is 30 µm or less, the dark part between adjacent ones of the light emitting elements 20 (in this case, between the light transmissive members 40A) in the light emitting device 100 can be reduced as compared to the case where the distance between adjacent ones of the light emitting elements 20 is 50 µm or less as in the first embodiment. The distance between adjacent ones of the light transmissive members 40A is further preferably 20 µm or less. When the distance between the light transmissive members 40A is 20 µm or less, the dark part between adjacent light emitting elements 20 (in this case, between the light transmissive members 40A) in the light emitting device 100A can be further reduced. For ease of manufacturing, the distance between adjacent ones of the light transmissive members 40A is preferably 10 µm or more.

In the light emitting device 100A, the covering member 30 is disposed on the substrate 10 between the light emitting elements 20 and between the light transmissive members 40A to be adjacent to the light transmissive members 40A such that an upper surface of the covering member 30 is substantially coplanar with the upper surfaces of the light transmissive members 40A. The frame body 50A has a substantially rectangular shape in a cross-sectional view and has a height that is the same as a height of the light transmissive members 40A. The covering member 30 is disposed on the substrate 10 between the frame body 50A and the light emitting elements 20 and the light transmissive members 40A, such that an upper surface of the covering member 30 is substantially coplanar with the upper surfaces of the light transmissive members 40A. That is, the covering member 30 is disposed to fill an entirety of a space between adjacent ones of the light emitting elements 20 and between adjacent ones of the light transmissive members 40A, and an entirety of a space between the frame body 50A and corresponding ones of the light emitting elements 20 and corresponding ones of the light transmissive members 40A. In the light emitting device 100A, the upper surface of the covering member 30 and the upper surfaces of the light transmissive members 40A are in the same plane.

Method of Manufacturing Light Emitting Device

Next, a description will be given of an exemplary method of manufacturing the light emitting device according to the second embodiment.

Figure 6:
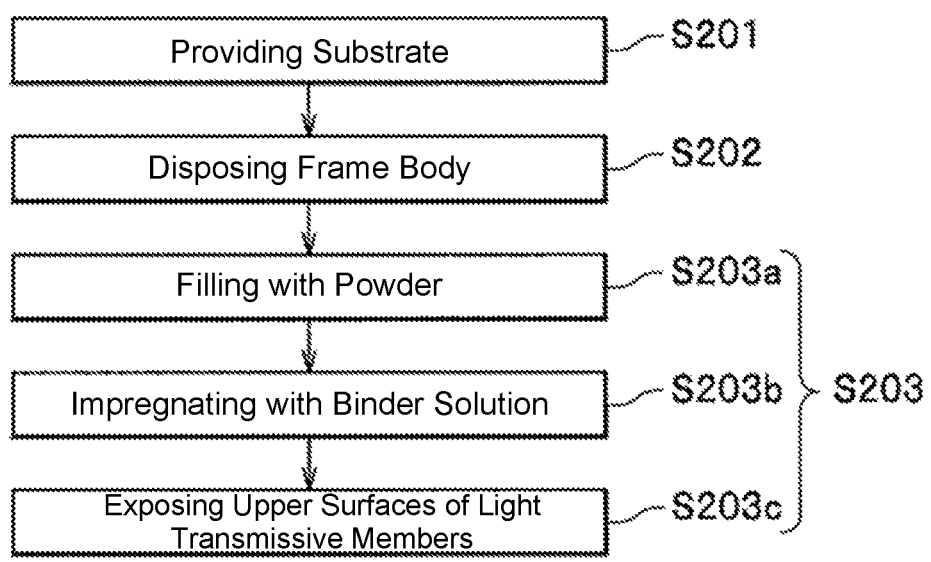
FIG. 6 is a flowchart of a method of manufacturing the light emitting device according to the second embodiment.
Figure 7A:
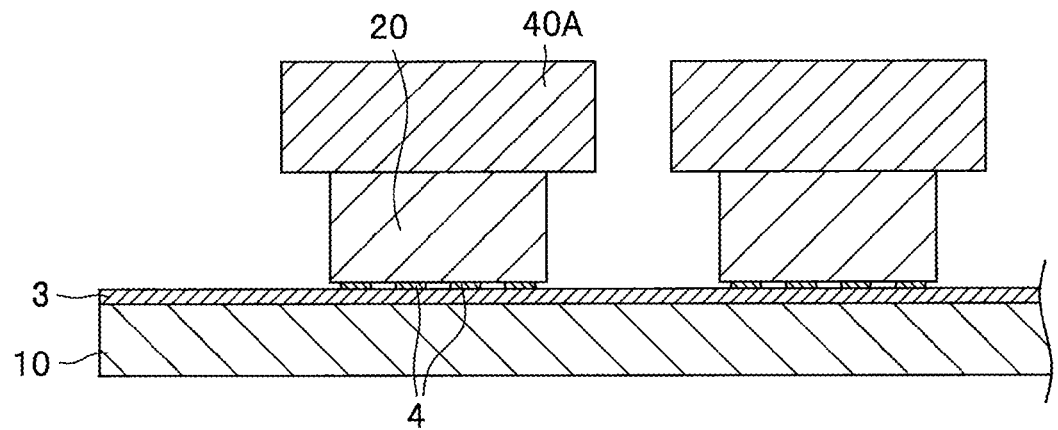
FIG. 7A is a cross-sectional view schematically showing providing a substrate in the method of manufacturing the light emitting device according to the second embodiment.
Figure 7B:
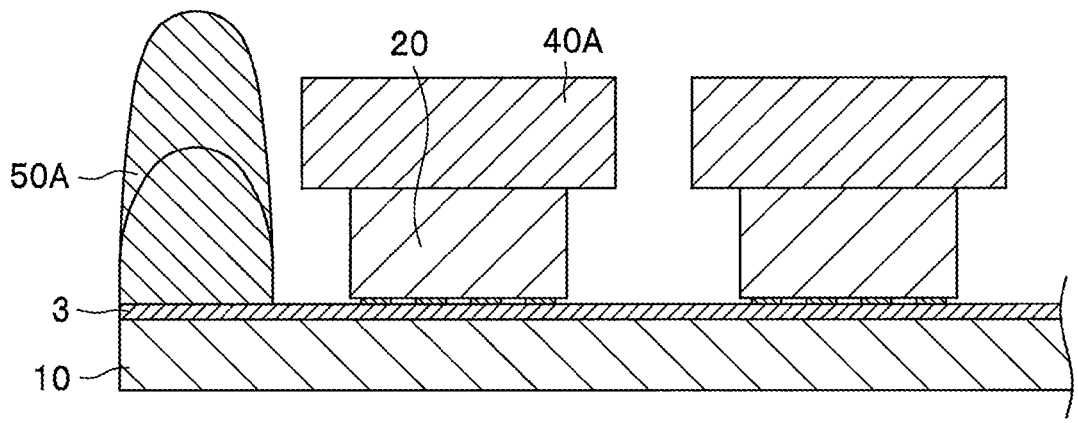
FIG. 7B is a cross-sectional view schematically showing disposing the frame body in the method of manufacturing the light emitting device according to the second embodiment.
Figure 7C:
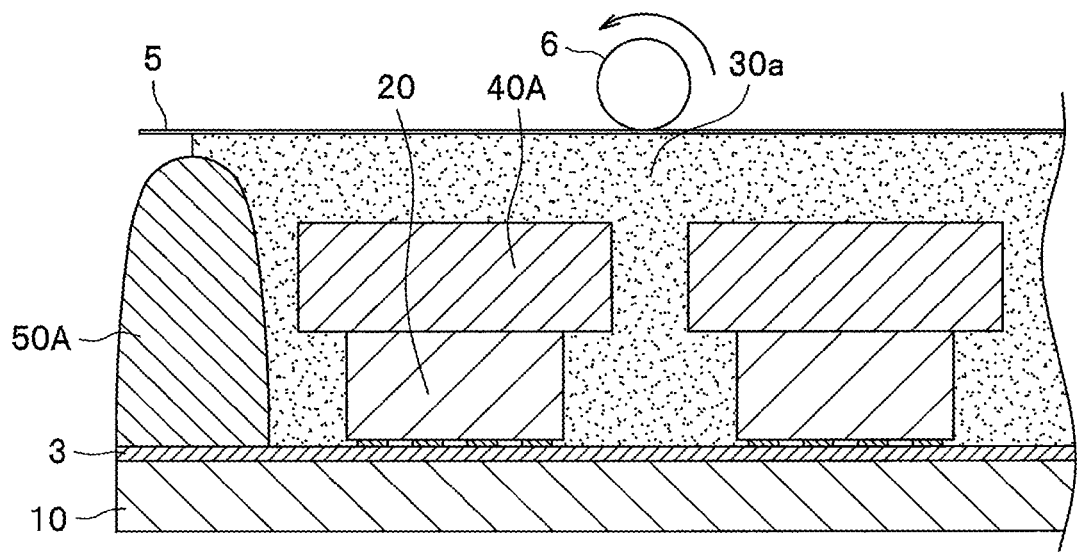
FIG. 7C is a cross-sectional view schematically showing filling with an inorganic material powder in the method of manufacturing the light emitting device according to the second embodiment.
Figure 7D:
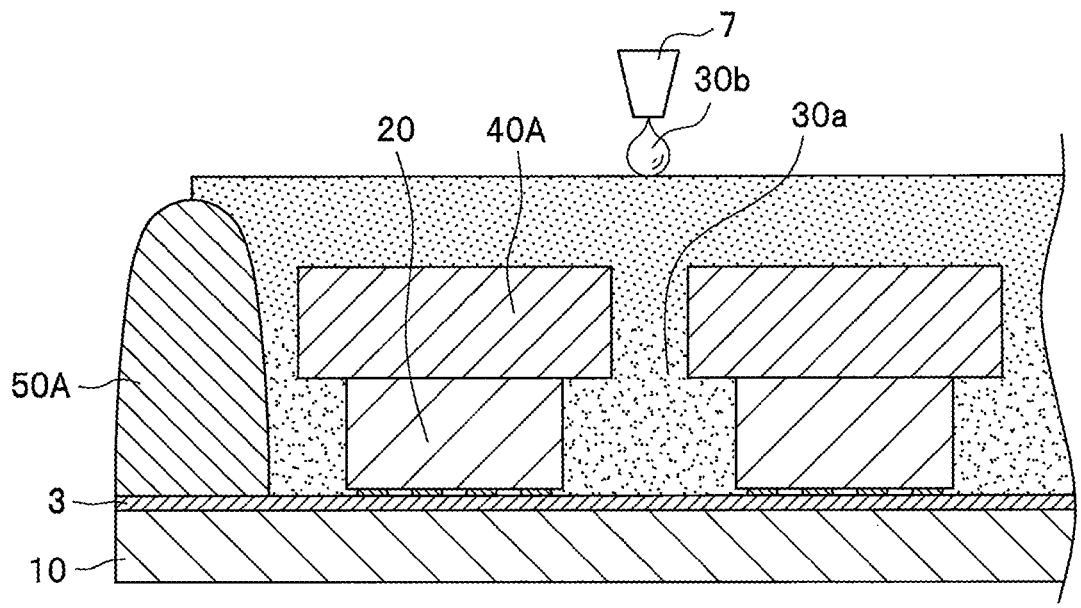
FIG. 7D is a cross-sectional view schematically showing impregnating with a binder solution in the method of manufacturing the light emitting device according to the second embodiment.
Figure 7E:
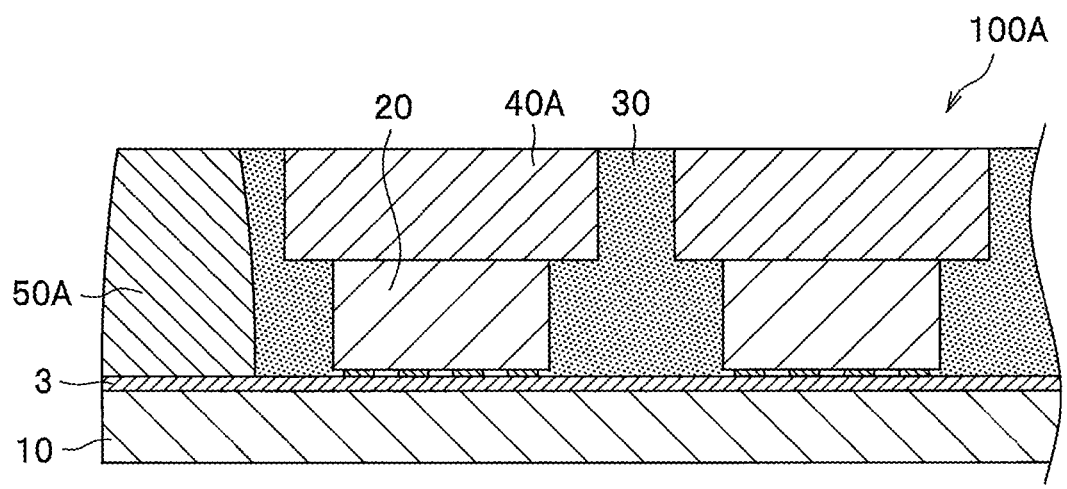
FIG. 7E is a cross-sectional view schematically showing exposing upper surfaces of light transmissive members in the method of manufacturing the light emitting device according to the second embodiment.

FIG. 6 is a flowchart of the method of manufacturing the light emitting device according to the second embodiment. FIG. 7A is a cross-sectional view showing providing a substrate in the method of manufacturing the light emitting device according to the second embodiment. FIG. 7B is a cross-sectional view showing disposing a frame body in the method of manufacturing the light emitting device according to the second embodiment. FIG. 7C is a cross-sectional view showing filling with inorganic material powder in the method of manufacturing the light emitting device according to the second embodiment. FIG. 7D is a cross-sectional view showing impregnating with a binder solution in the method of manufacturing the light emitting device according to the second embodiment. FIG. 7E is a cross-sectional view showing exposing the upper surfaces of light transmissive members in the method of manufacturing the light emitting device according to the second embodiment.

The method of manufacturing the light emitting device 100A includes: a step S201 of providing the substrate 10 on which a plurality of light emitting elements 20 with light transmissive members 40A are mounted, each of the light transmissive members 40A disposed on an upper surface of a respective one of the plurality of light emitting elements 20; a step S202 of disposing a frame body, in which the frame body 50A is disposed to surround the plurality of light emitting elements 20; and a step S203 of disposing a covering member, in which the covering member 30 is disposed on the substrate 10 between adjacent ones of the light emitting elements 20 and between adjacent ones of the light transmissive members 40A such that an upper surface of the covering member 30 is substantially coplanar with upper surfaces of the light transmissive members 40A.

The step S203 of disposing a covering member includes: a step S203a of filling with a powder, in which a space on the substrate 10 between the light emitting elements 20 and between the light transmissive members 40A is filled with an inorganic material powder; a step S203b of impregnating with a binder solution, in which the inorganic material powder is impregnated with a binder solution; and step S203c of exposing upper surfaces of the light transmissive members, in which a solid of the inorganic material powder is polished to expose the upper surface of each of the light transmissive members 40A.

Materials, arrangement, and the like of the members in this method of manufacturing the light emitting device 100A are as those in the description of the light emitting device 100A described above and, therefore, a detailed description thereof may be omitted when appropriate.

Providing Substrate

In the step S201 of providing a substrate, the substrate 10 on which a plurality of light emitting elements 20 with the light transmissive members 40A are disposed is provided, each of the light transmissive members 40A disposed on or above a respective one of the plurality of light emitting elements 20.

In the step S201, for example, each of the light transmissive members 40A of a predetermined shape is bonded to the upper surface (at the light extraction surface side) of a respective one of the light emitting elements 20. When bonding the light transmissive members 40A to the light emitting elements 20, the light transmissive members 40A may be directly bonded or indirectly bonded via a light guide member. Next, the plurality of light emitting elements 20 are mounted on the substrate 10 with the light transmissive members 40A facing upward. The light emitting elements 20 are flip-chip mounted on the wiring parts 3 on the upper surface of the substrate 10 via the conductive bonding member 4, with an electrode-formed surface of each light emitting element 20 serving as a mount surface.

In the step S201, for example, each of the light emitting elements 20 and a respective one of the light transmissive members 40A may be bonded together after mounting the light emitting elements on the substrate 10.

Disposing Frame Body

In the step S202 of disposing a frame body, the frame body 50A is disposed to surround the plurality of light emitting elements 20. The frame body 50A is formed similarly as in the step S102 of disposing a frame body described above, except that the frame body 50A is formed to have a height greater than a height of the light transmissive members 40A with the plurality of light emitting elements 20. A resin used for the frame body 50A can be applied twice to obtain the frame body 50A having a predetermined height (see FIG. 7B).

Disposing Covering Member

In the step S203 of disposing a covering member, the covering member 30 is disposed on the substrate 10 between the light emitting elements 20 and between the light transmissive members 40A such that an upper surface of the covering member 30 is substantially coplanar with the upper surfaces of the light transmissive members 40A. In the step S203, the covering member 30 is disposed also between the frame body 50A and the light emitting elements 20 and the light transmissive members 40A.

This step S203 includes a step S203a of filling with a powder, a step S203b of impregnating with a binder solution, and a step S203c of exposing upper surfaces of the light transmissive members.

Filling with Powder

In the step S203a of filling with a powder, a space on the substrate 10 between adjacent ones of the light emitting elements 20 and between adjacent ones of the light transmissive members 40A is filled with the inorganic material powder 30a. In the step S203a, the space on the substrate 10 between the frame body 50A and the light emitting elements 20 and the light transmissive members 40A is also filled with the inorganic material powder 30a.

In the step S203a, on the substrate 10, the inorganic material powder 30a is disposed such that a top of the inorganic material powder 30a is located above the upper surfaces of the light transmissive members 40A, so as to cover the upper surfaces of the light transmissive members 40A. Next, a plate-like member 5 is mounted on the upper surface of the inorganic material powder 30a, and the powder is compressed by a roller 6 via the plate-like member 5. Instead of the roller 6, a device configured to apply pressure evenly from the upper surface of the inorganic material powder 30a, such as a press machine, may be used to perform compressing.

Impregnating with Binder Solution

The step S203b of impregnating with a binder solution is similar to the step S103b of impregnating with a binder solution described above.

Light Transmissive Member Upper Surface Exposing Step

In the step S203c of exposing upper surfaces of the light transmissive members, a solid of the inorganic material powder is polished to expose the upper surfaces of the light transmissive members 40A and the upper surface of the frame body 50A.

In the step S203c, by polishing the upper surface of the solid of the inorganic material powder which has been impregnated with the binder solution and solidified, a portion of the covering member 30 is removed. Thus, a portion of the covering member 30 covering the upper surfaces of the light transmissive members 40A is removed, so that the upper surfaces of the light transmissive members 40A are exposed. Furthermore, in the step S203c, when a portion of the covering member 30 is removed, a portion of the frame body 50A is removed together with a portion of the covering member 30 covering the upper surface of the frame body 50A, so that the upper surface of the frame body 50A is exposed. Thus, the upper surface of the covering member 30, the upper surfaces of the light transmissive members 40A, and the upper surface of the frame body 50A are located in the same plane. When removing a portion of the covering member 30 to expose the upper surfaces of the light transmissive members 40A and the upper surface of the frame body 50A, the portion of the covering member 30 may be removed by grinding, cutting or the like.

Third Embodiment

Light Emitting Device

Figure 8A:
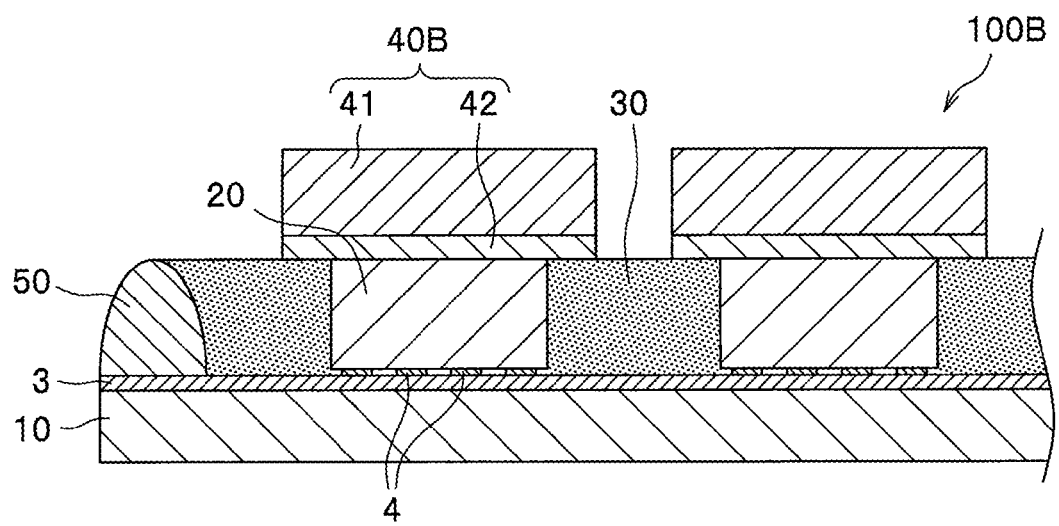
FIG. 8A is a cross-sectional view schematically showing a portion of the structure of a light emitting device according to a third embodiment.

FIG. 8A is a cross-sectional view schematically showing a portion of the structure of a light emitting device according to a third embodiment.

The main difference of a light emitting device 100B from the light emitting device 100 will be described below.

The light emitting device 100B is different from the light emitting device 100 in that light transmissive members 40B, each including a transparent member 41 and a wavelength conversion member layer 42, are disposed on the light extraction surfaces of respective light emitting elements 20.

In each of the light transmissive members 40B, the wavelength conversion member layer 42 is disposed on a lower surface of the transparent member 41. Examples of the transparent member 41 include a molded body of resin, glass, ceramic, and the like. Examples of the wavelength conversion member layer 42 include a resin layer containing a fluorescent material.

In the light emitting device 100B, the light transmissive members 40B are spaced apart from each other corresponding to the light emitting elements 20, and each of the light transmissive members 40B is bonded to the light extraction surface of a respective one of the light emitting elements 20.

Method of Manufacturing Light Emitting Device

Next, an example of a method of manufacturing the light emitting device according to the third embodiment will be described below.

The light emitting device 100B is manufactured by disposing the light transmissive members 40B each including the wavelength conversion member layer 42 disposed on the light emitting elements 20 side in the step S104 of disposing a light transmissive member in the method of manufacturing the light emitting device 100. The light transmissive members 40B of a predetermined shape may be disposed for respective ones of the light emitting elements 20.

Alternatively, the light transmissive members 40B may be disposed such that a single light transmissive member 40B covers the whole upper surfaces of a plurality of light emitting elements 20, and is thereafter cut into individual light transmissive members 40B to be spaced apart from each other corresponding to respective ones of the light emitting elements 20, so that the light transmissive members 40B can be disposed for respective ones of the light emitting elements 20.

A resin containing a reflective member may be disposed between adjacent ones of the light transmissive members 40B.

Fourth Embodiment

Light Emitting Device

Figure 8B:
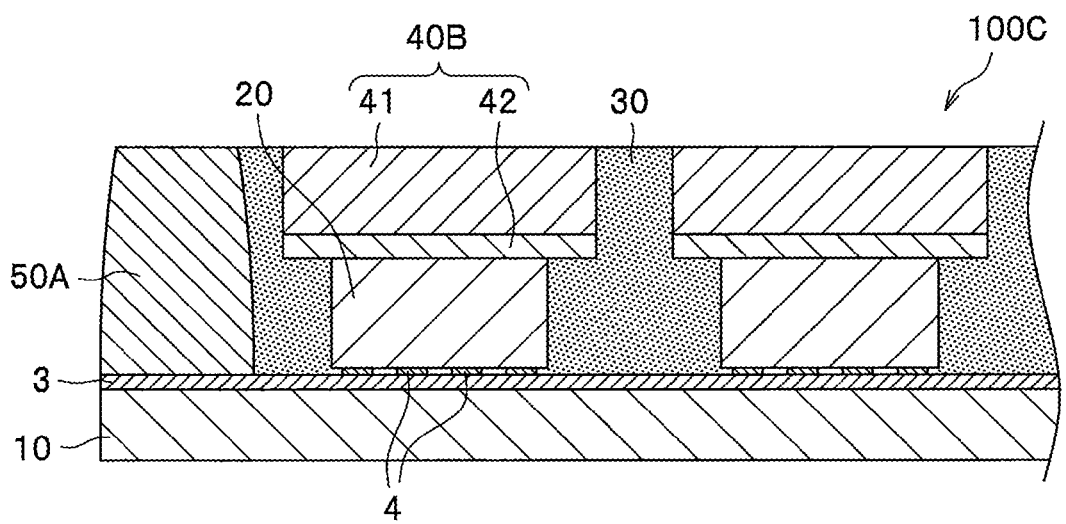
FIG. 8B is a cross-sectional view schematically showing a portion of the structure of a light emitting device according to the fourth embodiment.

FIG. 8B is a cross-sectional view schematically showing a portion of the structure of a light emitting device according to a fourth embodiment.

The main difference of a light emitting device 100C from the light emitting device 100A will be described below.

The light emitting device 100C is different from the light emitting device 100A in that the light extraction surface of each of the light emitting elements 20 is provided with a respective ones of the light transmissive members 40B each including the transparent member 41 and the wavelength conversion member layer 42.

Method of Manufacturing Light Emitting Device

Next, a description will be given of an example of a method of manufacturing the light emitting device according to the fourth embodiment.

The light emitting device 100C is manufactured by, in the step S201 of providing a substrate in the method of manufacturing the light emitting device 100A, providing the substrate 10 with a plurality of light emitting elements 20 on each of which a respective one of the light transmissive members 40B is disposed, each of the light transmissive members 40B including a respective wavelength conversion member layer 42 disposed on the light emitting element 20 side.

Fifth Embodiment

Light Emitting Device

Figure 8C:
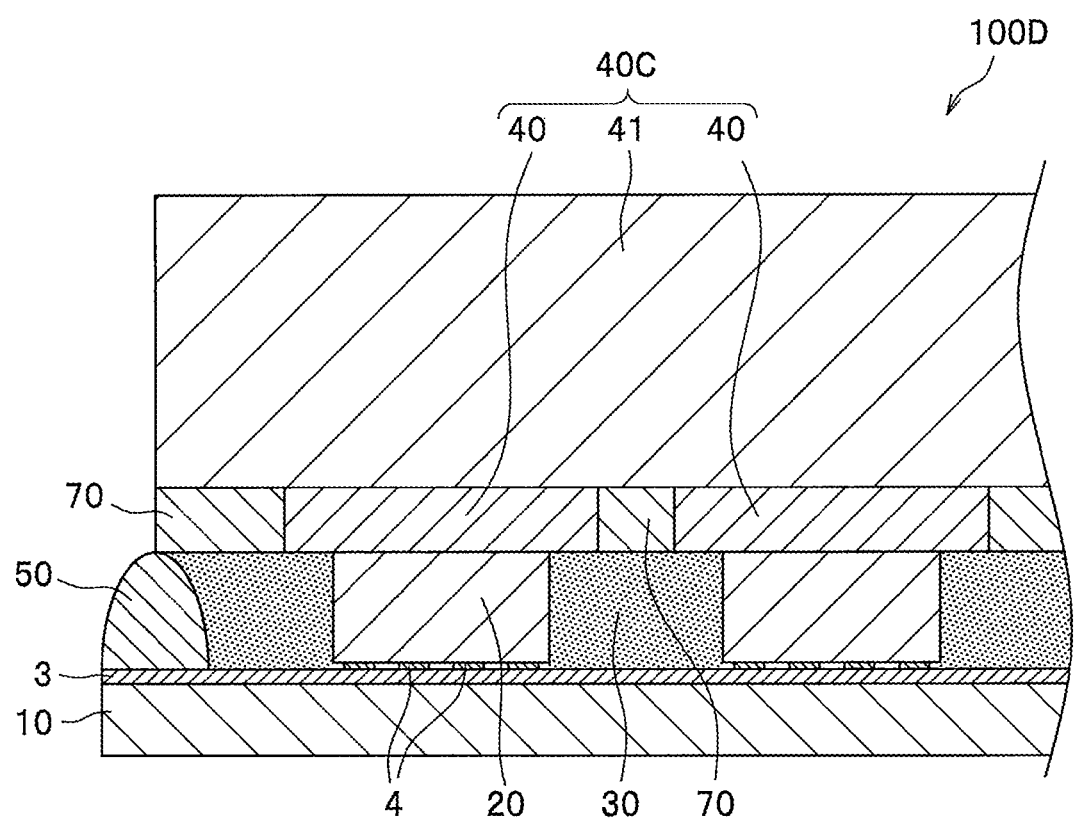
FIG. 8C is a cross-sectional view schematically showing a portion of the structure of a light emitting device according to a fifth embodiment.

FIG. 8C is a cross-sectional view schematically showing a portion of the structure of a light emitting device according to a fifth embodiment.

The main difference of a light emitting device 100D from the light emitting device 100 will be described below.

The light emitting device 100D is different from the light emitting device 100 in that the light transmissive members 40 are spaced apart from each other corresponding to respective ones of the light emitting elements 20, and a resin 70 is disposed between light transmissive members 40 and on the covering member 30 between the frame body 50 and the light emitting elements 20. Furthermore, the light emitting device 100D is different from the light emitting device 100 in that the light extraction surfaces of the light emitting elements 20 are provided with a light transmissive member 40C that includes the light transmissive members 40 and the transparent member 41.

The light transmissive member 40C includes the transparent member 41 disposed on the light transmissive members 40. In the light emitting device 100D, the light transmissive members 40 are spaced apart from each other corresponding to respective ones of the light emitting elements 20.

The resin 70 containing a reflective member is disposed between the light transmissive members 40. The frame body 50 has a height same as a height of the light transmissive members 40.

The resin 70 containing a reflective member is disposed on the covering member 30 between the frame body 50 and the light emitting elements 20. In the light emitting device 100D, the transparent member 41 is disposed to cover the entirety of upper surfaces of the plurality of light transmissive members 40. The light emitting device may not include the resin 70.

Method of Manufacturing Light Emitting Device

Next, a description will be given of an example of a method of manufacturing the light emitting device according to the fifth embodiment.

Figure 9:
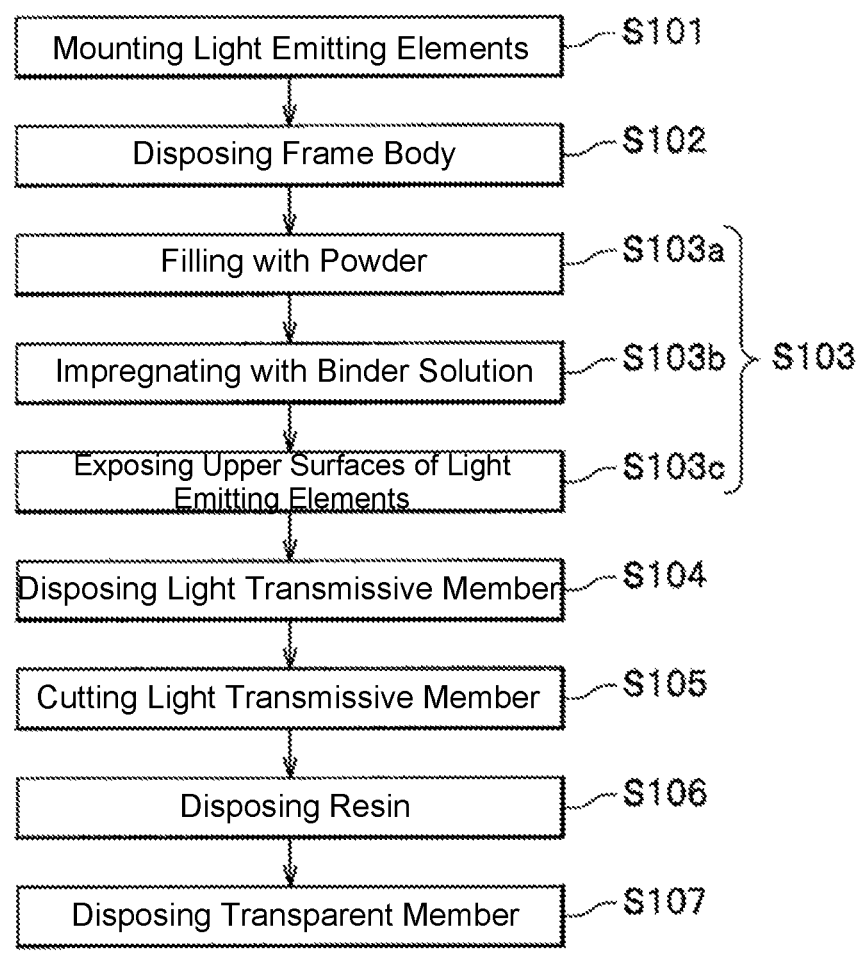
FIG. 9 is a flowchart showing a method of manufacturing the light emitting device according to the fifth embodiment.

FIG. 9 is a flowchart of the method of manufacturing the light emitting device according to the fifth embodiment.

In the method of manufacturing the light emitting device 100D, in a step S104 of disposing a light transmissive member, the light transmissive member 40 is disposed on the plurality of light emitting elements 20. Next, in a step S105 of cutting the light transmissive member, the light transmissive member is cut so as to be spaced apart from each other corresponding to the light emitting elements 20. Next, in a step S106 of disposing a resin, the resin 70 containing a reflective member is disposed between adjacent ones of the light transmissive members 40 and on the covering member 30 between the frame body 50 and the light emitting elements 20 such that an upper surface of the resin 70 is located above the upper surfaces of the light transmissive members 40. Then, the surfaces of the light transmissive members 40 and the surface of the resin 70 are flattened by polishing, grinding or the like. Thereafter, in a step S107 of disposing a transparent member, the transparent member 41 is disposed on the upper surfaces of the light transmissive members 40. The covering member 30 may serve as the resin 70. In this case, the covering member 30 employed instead of the resin 70 may be disposed using a technique as in the step S103 of disposing a covering member described above.

Sixth Embodiment

Light Emitting Device

Figure 10:
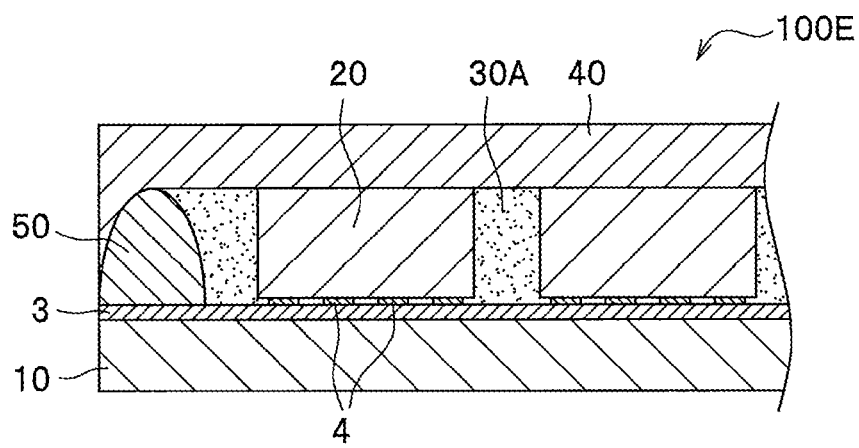
FIG. 10 is a cross-sectional view schematically showing part of the structure of a light emitting device according to a sixth embodiment.

FIG. 10 is a cross-sectional view schematically showing a portion of the structure of a light emitting device according to a sixth embodiment.

A light emitting device 100E includes: the substrate 10; a plurality of light emitting elements 20 mounted on the substrate 10; a covering member 30A disposed on the substrate 10 between adjacent ones of the light emitting elements 20 such that an upper surface of the covering member 30 is substantially coplanar with the upper surfaces of the light emitting elements 20; and the light transmissive member 40 disposed above the plurality of light emitting elements 20. The covering member 30A is a molded body of $TiO_2$ powder.

The light emitting device 100E further includes, on the substrate 10, the frame body 50 disposed surrounding the plurality of light emitting elements 20. The covering member 30A is disposed between the frame body 50 and the light emitting elements 20.

The main difference of the light emitting device 100E from the light emitting device 100 will be described below.

The light emitting device 100E is different from the light emitting device 100 in that the covering member 30A is a molded body of $TiO_2$ powder. That is, in the light emitting device 100E, the covering member 30A is formed of compressed $TiO_2$ powder, and is composed of only $TiO_2$. When the light transmissive member 40 is disposed by potting, the covering member 30A may be impregnated with a resin of the light transmissive member. That is, the expression that "the covering member 30A is a molded body of $TiO_2$" refers to not only a case in which the covering member 30A is composed only of $TiO_2$, but also a case in which the covering member 30A is impregnated with the resin of the light transmissive member.

Using the covering member 30A of such a structure also allows for obtaining the effect similar to that of the light emitting device 100, and the light emitting device 100E has high contrast. Furthermore, luminance of the light emitting device 100E can be increased.

Method of Manufacturing Light Emitting Device

Next, a description will be given of an example of a method of manufacturing the light emitting device according to the sixth embodiment.

Figure 11:
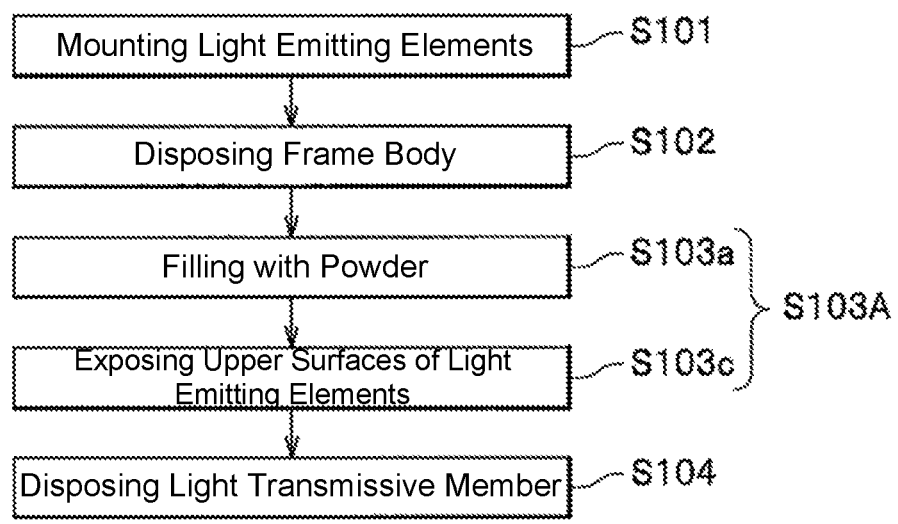
FIG. 11 is a flowchart of a method of manufacturing the light emitting device according to the sixth embodiment.

FIG. 11 is a flowchart of the method of manufacturing the light emitting device according to the sixth embodiment.

The method of manufacturing the light emitting device 100E includes: a step S101 of mounting a light emitting element, in which a plurality of light emitting elements 20 are mounted on the substrate 10; a step S102 of disposing a frame body, in which the frame body 50 is disposed to surround the plurality of light emitting elements 20; a step S103A of disposing a covering member, in which the covering member 30 is disposed on the substrate 10 between adjacent ones of the light emitting elements 20, such that an upper surface of the covering member 30 is substantially coplanar with upper surfaces of the light emitting elements 20; and a step S104 of disposing a light transmissive member, in which the light transmissive member 40 is disposed above the plurality of light emitting elements 20.

The step S103A of disposing a covering member includes: a step S103a of filling with a powder, in which a space on the substrate 10 between the light emitting elements 20 is filled with $TiO_2$ powder; and a step S103c of exposing upper surfaces of the light emitting elements, in which a portion of the $TiO_2$ powder is removed to expose upper surfaces of light emitting elements 20.

In the method of manufacturing the light emitting device 100E, in the step S103a of filling with a powder of the step S103A of disposing a covering member, $TiO_2$ powder is used as the inorganic material powder. The step S103b of impregnating with a binder solution is not performed, and the $TiO_2$ powder is not impregnated with the binder solution 30b. In the step S103c of exposing upper surfaces of the light emitting elements, the compressed $TiO_2$ powder is wiped with, for example, a swab or fabric. Thus, a portion of the $TiO_2$ powder, that is, a portion of the covering member 30A is removed, to expose the upper surfaces of the light emitting elements 20. Note that, when removing a portion of the covering member 30A to expose the upper surfaces of the light emitting elements 20, the portion of the covering member 30A may be removed by polishing, grinding, cutting or the like.

The other operations are similar to those in the method of manufacturing the light emitting device 100.

Seventh Embodiment

Light Emitting Device

Figure 12:
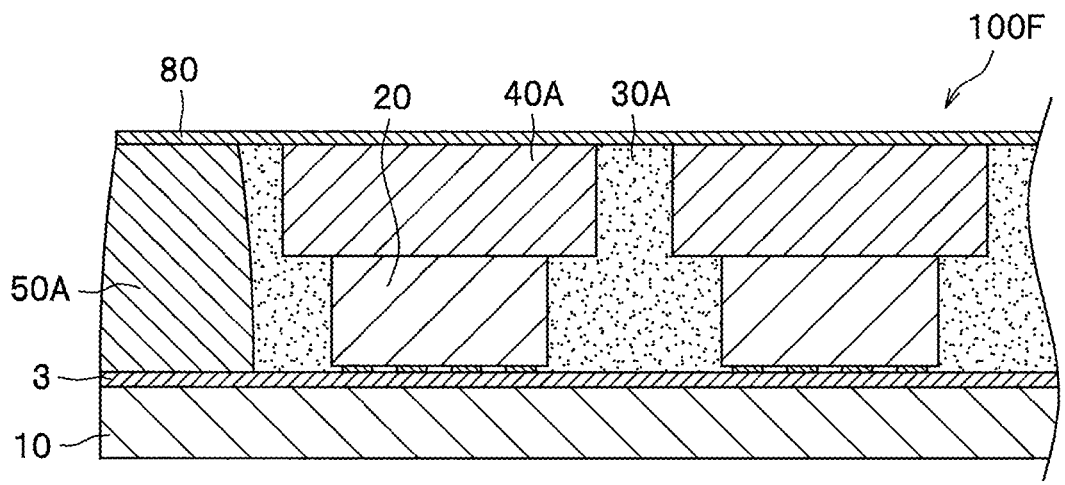
FIG. 12 is a cross-sectional view schematically showing part of the structure of a light emitting device according to a seventh embodiment.

FIG. 12 is a cross-sectional view schematically showing a portion of the structure of the light emitting device according to the seventh embodiment.

A light emitting device 100F includes: a substrate 10; a plurality of light emitting elements 20 mounted on the substrate 10; light transmissive members 40A spaced apart from each other corresponding to respective ones of the plurality of light emitting elements 20 and each disposed above a respective one of the light emitting elements 20; and the covering member 30A disposed on the substrate 10 between adjacent ones of the light emitting elements 20 and between adjacent ones of the light transmissive members 40A such that an upper surface of the covering member 30 is substantially coplanar with upper surfaces of the light transmissive members 40A are located. The covering member 30A is a molded body that contains $TiO_2$ powder. The light emitting device 100F further includes, on the substrate 10, the frame body 50A surrounding the plurality of light emitting elements 20. The covering member 30A is disposed between the frame body 50A and the light emitting elements 20. The light emitting device 100F further includes a coat layer 80 on upper surfaces of the frame body 50A, the covering member 30A, and the light transmissive members 40A.

The main difference of the light emitting device 100F from the light emitting device 100A will be described below.

The light emitting device 100F is different from the light emitting device 100A in that the covering member 30A is a molded body of $TiO_2$ powder. That is, in the light emitting device 100F, the covering member 30A is formed of compressed $TiO_2$ powder and composed of solely $TiO_2$.

The covering member 30A of such a structure also attains the effect similar to that of the light emitting device 100A, and contrast of the light emitting device 100F can be increased. Furthermore, luminance of the light emitting device 100F can be increased.

The light emitting device 100F is different from the light emitting device 100A in including the coat layer 80. With the coat layer 80, in the light emitting device 100F, the $TiO_2$ powder that forms the covering member 30A can be prevented from being fell off from the upper surfaces of the light emitting device. The thickness of the coat layer 80 is in a range of, for example, 3 μm to 10 μm.

The coat layer 80 is formed of, for example, a light-transmissive resin. Examples of a resin material for the coat layer 80 include a thermosetting resin such as an epoxy resin, a modified epoxy resin, a silicone resin, a modified silicone resin, and the like.

Method of Manufacturing Light Emitting Device

Next, a description will be given of an example of a method of manufacturing the light emitting device according to the seventh embodiment.

Figure 13:
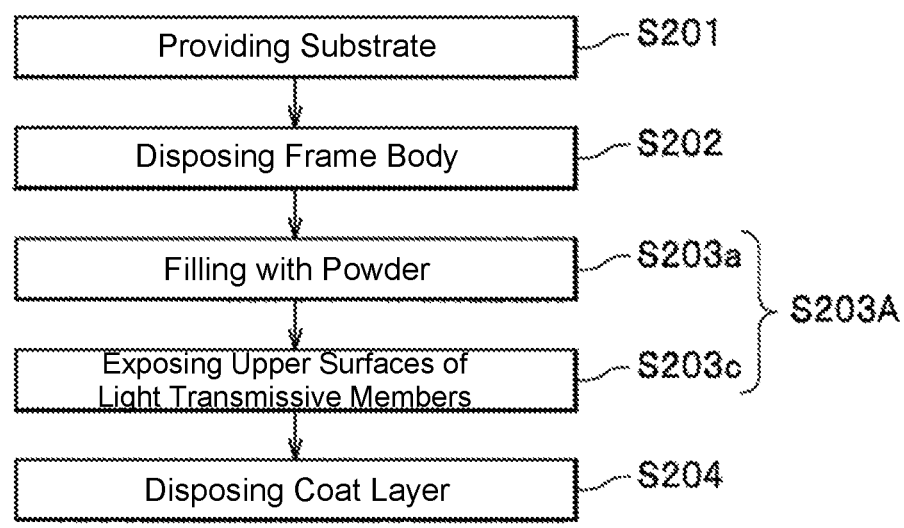
FIG. 13 is a flowchart of a method of manufacturing the light emitting device according to the seventh embodiment.

FIG. 13 is a flowchart of the method of manufacturing the light emitting device according to the seventh embodiment.

The method of manufacturing the light emitting device 100F includes: a step S201 of providing a substrate, in which the substrate 10 with a plurality of light emitting elements 20 is provided, the plurality of light emitting elements 20 provided with light transmissive members 40A each disposed on an upper surface of a respective one of the plurality of light emitting elements 20; a step S202 of disposing a frame body, in which the frame body 50A is disposed to surround the plurality of light emitting elements 20; a step S203A of disposing a covering member, in which the covering member 30A is disposed on the substrate 10 between adjacent ones of the light emitting elements 20 and between adjacent ones of the light transmissive members 40A such that an upper surface of the covering member 30 is substantially coplanar with the upper surfaces of the light transmissive members 40A; and a step S204 of disposing a coat layer, in which the coat layer 80 is disposed on an upper surface of the frame body 50A, an upper surface of the covering member 30A, and upper surfaces of the light transmissive members 40A.

The step S203A of disposing a covering member includes: a step S203a of filling with a powder, in which a space on the substrate 10 between adjacent ones of the light emitting elements 20 and between adjacent ones of the light transmissive members 40A are filled with TiO$_2$ powder; and step S203c of exposing upper surfaces of the light transmissive members, in which a portion of the TiO$_2$ powder is removed to expose the upper surfaces of the light transmissive members 40A.

In the method of manufacturing the light emitting device 100F, in the step S203a of filling with a powder in the step S203A of disposing a covering member, TiO$_2$ powder is used for the inorganic material powder. The step S203b of impregnating with a binder solution is not performed, and the TiO$_2$ powder is not impregnated with the binder solution 30b. In the step S203c of exposing upper surfaces of the light transmissive members, the compressed TiO$_2$ powder is wiped with, for example, a swab or fabric. Thus, a portion of the TiO$_2$ powder, that is, a portion of the covering member 30A is removed to expose the upper surfaces of the light transmissive members 40A. In this removal, a portion of the covering member 30A covering the upper surface of the frame body 50A is removed by wiping with a swab or fabric, polishing, grinding, cutting or the like, and a portion of the frame body 50A is removed by polishing, grinding, cutting, or the like, to expose the upper surface of the frame body 50A. When removing a portion of the covering member 30A to expose the upper surfaces of the light transmissive members 40A, a portion of the covering member 30A may be removed by polishing, grinding, cutting, or the like.

In the step S204 of disposing a coat layer, the coat layer 80 is disposed on the upper surface of the frame body 50A, the upper surface of the covering member 30A, and the upper surfaces of the light transmissive members 40A.

In this step S204, the coat layer 80 is disposed by, for example, application by spraying, bonding a resin sheet or the like.

Other operations are similar to those in the method of manufacturing the light emitting device 100A.

The light emitting devices 100B, 100C, 100D may also employ the covering member 30A, which is a molded body of TiO$_2$ powder. In this case, the light emitting devices 100B, 100C may also include the coat layer 80. In such cases, the light emitting device can be manufactured according to the method of manufacturing the light emitting devices 100E, 100F described above.

Other Embodiments

While each of the light emitting devices described above includes the frame body, the light emitting device according to the present disclosure may not include the frame body.

While the light emitting device 100F includes the coat layer 80, the light emitting device according to the present disclosure may not include the coat layer 80. The coat layer 80 is preferably disposed at least on the upper surface of the covering member 30A.

While each of the light emitting devices 100 and 100E includes the light transmissive member 40, a single light transmissive member 40A may be continuously disposed to cover the entirety of the upper surfaces of the plurality of light emitting elements 20 after the covering member 30 or 30A is formed.

While each of the light emitting devices 100B includes the light transmissive members 40B each including the wavelength conversion member layer 42 disposed on the lower surface of a respective one of the transparent members 41, the light emitting devices 100B may be manufactured using the light transmissive member 40 or the light transmissive members 40A instead of the light transmissive members 40B. In the case of using the light transmissive member 40, after the disposing the light transmissive member 40 in the method of manufacturing the light emitting device 100, a surface of the light transmissive member 40 may be flattened by polishing, grinding or the like, and the light transmissive member 40 may be cut so as to be spaced from one another corresponding to respective ones of the light emitting elements 20. In the case of using the light transmissive members 40A, after the covering member 30 or 30A is disposed in the method of manufacturing the light emitting device 100, the light transmissive members 40A of a predetermined shape may be disposed for respective ones of the light emitting elements 20. Alternatively, when the light transmissive members 40A are employed, a single light transmissive member 40A may be continuously disposed to cover the entirety of the upper surfaces of the plurality of light emitting elements 20, and thereafter the light transmissive member 40A may be cut to be spaced apart from each other corresponding to respective ones of the light emitting elements 20, so as to be disposed for respective ones of the light emitting elements 20.

In the light emitting device 100B, the light transmissive members 40B may be disposed continuously to cover the entirety of the upper surfaces of the plurality of light emitting elements 20. In the light emitting device 100D, the light transmissive members 40 may be continuously disposed so as to cover an entirety of the upper surfaces of the plurality of light emitting elements 20.

The method of manufacturing the light emitting device may include additional steps between, before, or after the steps the steps described above to the extent that the additional steps do not adversely affect the steps described above. For example, the method may include a step of removing a foreign object, in which a foreign object mixed during manufacture is removed.

In the method of manufacturing the light emitting device, some of the steps may be performed in any appropriate order, and the order of some of the steps may be interchanged. For example, while the disposing the frame body is performed after the mounting the light emitting elements on the substrate in the method of manufacturing the light emitting device described above, the disposing the frame body may be performed before the mounting the light emitting elements.

Example

An Example will be described below.

In the Example, the light emitting device in FIGS. 1A to 1D was manufactured in the manner described below according to the method of manufacturing according to the first embodiment.

Aluminum nitride was used for the substrate, and Cu was used for the wiring parts. The substrate had a size of 40 mm×10 mm. TiO$_2$ was used for the inorganic material of the covering member was, and a glass solution (polysilazane solution) was used for the binder solution. The amount of the binder solution was 10 μl to the inorganic material of 4.5 g. For the light transmissive member, a silicone resin that contained YAG fluorescent material of a particle size of 16 μm was used. For the frame body, a silicone resin that contained TiO$_2$ as the optical reflective member was used. The light emitting elements had a size of 600 μm×600 μm, and the distance between adjacent ones of the light emitting elements was 50 μm.

Comparative Example

In a Comparative Example, a light emitting device was manufactured to have a structure similar to that of the light emitting device of the Example, except that a silicone resin that contained $TiO_2$ was used for the covering member.

The covering member contained $TiO_2$ by 60% mass ratio to resin.

A pulsed current of 350 mA per a single light emitting element was flowed to the light emitting device to evaluate the contrast (blue light) and the contrast (white light) and to measure the average luminance ($cd/mm^2$).

The contrast was evaluated by measuring the luminance of light emitted frontward. The contrast (blue light) was the contrast before the light transmissive member was provided. The contrast (white light) was the contrast after the light transmissive member was provided.

The average luminance was the luminance of light emitted frontward in a region of 70% of the light emission region.

As the result, the light emitting device according to the Example showed the contrast (blue light) of 333:1, the contrast (white light) of 134:1, and the average luminance of 95.6 ($cd/mm^2$). On the other hand, the light emitting device of the Comparative Example showed the contrast (blue light) of 174:1, the contrast (white light) of 64:1, the average luminance of 93.8 ($cd/mm^2$).

The result showed that the light emitting device according to one embodiment of the present invention had high luminance and high contrast.

The light emitting device according to certain embodiments of the present disclosure is applicable to an adaptive driving beam headlamp light source. Furthermore, the light emitting device according to certain embodiments of the present disclosure is applicable to backlight light source for a liquid display device, various illumination devices, a large-size display devices, various display devices including a billboard or a directory board, an image reading device in a digital video camera, a facsimile, a copier, a scanner, or the like, a projector, etc.

In the description above, certain embodiments of a light emitting device and a method of manufacturing a light emitting device are described. However, the present invention is not limited the description above, and should be broadly construed on the basis of the claims. The present invention also encompasses variations and modifications that are made on the basis of the description above.

What is claimed is:

1. A light emitting device comprising:
   a substrate;
   a plurality of light emitting elements mounted on the substrate;
   a covering member disposed on the substrate between adjacent ones of the light emitting elements such that an upper surface of the covering member is substantially coplanar with upper surfaces of the light emitting elements, wherein:
   the covering member is a molded body containing an inorganic material powder and a binder,
   a content of the inorganic material powder in the covering member is in a range of 90 mass percent to 99.99 mass percent, and
   a content of the binder in the covering member is in a range of 0.01 mass percent to 10 mass percent; and
   a light transmissive member disposed on or above the plurality of light emitting elements.

2. The light emitting device according to claim 1, wherein the inorganic material is at least one of $TiO_2$, BN, $SiO_2$, and $Al_2O_3$.

3. The light emitting device according to claim 1, wherein the binder is polysilazane.

4. The light emitting device according to claim 1, wherein each of the light transmissive members comprises a transparent member and a wavelength conversion member layer on a lower surface of the transparent member.

5. The light emitting device according to claim 1, wherein the light transmissive member contains a wavelength conversion member.

6. The light emitting device according to claim 1, wherein a distance between adjacent ones of the light emitting elements is 70 μm or less.

7. The light emitting device according to claim 1, further comprising a frame body on the substrate surrounding the plurality of light emitting elements, wherein the covering member is disposed between the frame body and the light emitting elements.

8. The light emitting device according to claim 7, wherein a distance between the frame body and the light emitting elements is 200 μm or less.

9. A light emitting device comprising:
   a substrate;
   a plurality of light emitting elements mounted on the substrate;
   a plurality of light transmissive members spaced apart from each other corresponding to the plurality of light emitting elements and disposed on or above the light emitting elements; and
   a covering member disposed on the substrate between adjacent ones of the light emitting elements and between adjacent ones of the light transmissive members such that an upper surface of the covering member is substantially coplanar with upper surfaces of the light transmissive members, wherein the covering member is a molded body containing inorganic material powder and a binder.

10. The light emitting device according to claim 9, wherein:
    a content of the inorganic material powder in the covering member is in a range of 90 mass percent to 99.99 mass percent, and
    a content of the binder in the covering member is in a range of 0.01 mass percent to 10 mass percent.

11. A light emitting device comprising:
    a substrate;
    a plurality of light emitting elements mounted on the substrate;
    a covering member disposed on the substrate between adjacent ones of the light emitting elements such that an upper surface of the covering member is substantially coplanar with upper surfaces of the light emitting elements, wherein the covering member is a molded body of compressed $TiO_2$ powder; and
    a light transmissive member disposed on or above the plurality of light emitting elements.

12. A light emitting device comprising:
    a substrate;
    a plurality of light emitting elements mounted on the substrate;
    a plurality of light transmissive members spaced apart from each other corresponding to the plurality of light emitting elements and disposed on or above the light emitting elements; and a covering member disposed on the substrate between adjacent ones of the light emitting elements and between adjacent ones of the light transmissive members such that an upper surface of the covering member is substantially coplanar with upper surfaces of the light transmissive members, wherein the covering member is a molded body of compressed $TiO_2$ powder.

* * * * *